United States Patent
Papanikolaou et al.

(10) Patent No.: US 7,449,920 B2
(45) Date of Patent: Nov. 11, 2008

(54) POWER-AWARE CONFIGURABLE DRIVER CIRCUITS FOR LINES TERMINATED BY A LOAD

(75) Inventors: Antonis Papanikolaou, Athens (GR); Hua Wang, Leuven (BE); Miguel Miranda, Kessel-lo (BE); Francky Catthoor, Temse (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 72 days.

(21) Appl. No.: 11/156,087

(22) Filed: Jun. 17, 2005

(65) Prior Publication Data

US 2005/0280443 A1 Dec. 22, 2005

Related U.S. Application Data

(60) Provisional application No. 60/580,788, filed on Jun. 18, 2004.

(51) Int. Cl.
*H03K 19/0175* (2006.01)
*H03H 11/26* (2006.01)

(52) U.S. Cl. .................... 326/86; 326/68; 327/262
(58) Field of Classification Search .................. 326/86, 326/83, 68; 327/262, 108, 109
See application file for complete search history.

(56) References Cited

U.S. PATENT DOCUMENTS 4,805,195 A * 2/1989 Keegan ........................ 375/354
4,845,390 A * 7/1989 Chan ........................... 327/278
5,122,679 A * 6/1992 Ishii et al. .................... 327/147
6,819,138 B2 * 11/2004 Hogenmiller et al. ......... 326/82

OTHER PUBLICATIONS

Amrutur et al., "Speed and power scaling of SRAMs", IEEE Journal of Solid-State Circuits, vol. 35, Issue 2, pp. 175-185, Feb. 2000.
Austin et al., "Making typical silicon matter with Razor", IEEE Computer, vol. 37, Issue 3, pp. 57-65, Mar. 2004.
Benini et al., "System-level power optimization techniques and tools", ACM Trans. on Design Automation for Embedded Systems (TODAES), vol. 5, No. 2, pp. 115-192, Apr. 2000.
Charnes et al., "Data Envelopment Analysis: Theory, Methodology and Applications", Kluwer Academic, 1994.
Heald et al., "Variability in Sub-100nm SRAM Design", IEEE/ACM International Conference on Computer Aided Design, pp. 347-352, Nov. 2004.
Nose et al., "Vth-hopping scheme to reduce subthreshold leakage for low-power processors", IEEE Journal of Solid-State Circuits, vol. 37, Issue 3, pp. 413-419, Mar. 2002.
Rabaey et al., "Digital Integrated Circuits: a design perspective 2nd Edition"; Pearson Education Intl., 2003.

* cited by examiner

*Primary Examiner*—James H Cho
(74) *Attorney, Agent, or Firm*—Knobbe Martens Olson & Bear LLP

(57) ABSTRACT

The present invention provides a driver circuit for driving a line terminated by a load, wherein said driver circuit is configurable for design time selected energy/delay working points. The configuration capability is used, e.g. during runtime, for dynamically selecting a suitable energy/delay working point, given the circumstances wherein said driver circuit has to operate. The driver circuit is in particular targeted for on-chip communication, but is not limited thereto.

27 Claims, 25 Drawing Sheets

POWER-AWARE CONFIGURABLE DRIVER CIRCUITS FOR LINES TERMINATED BY A LOAD

RELATED APPLICATION

This patent application claims the benefit of U.S. Provisional Application No. 60/580,788, filed Jun. 18, 2004, and is incorporated herein in its entirety.

TECHNICAL FIELD OF THE INVENTION

The present invention relates to the field of apparatus and methods for electronic circuits, and in particular to driving circuits suitable for driving lines terminated by a load, such as for example data communication busses, within an essentially digital device. The present invention also relates to essentially digital or hybrid analog/digital devices including such driving circuits and methods of driving busses.

BACKGROUND OF THE INVENTION

A driver circuit for a line boosts signals transmitted over the line, which helps ensure that the signal reaches its destination. Such a driver circuit may be a driver circuit for a data communication pathway for data communication between functional units, such as e.g. a bus, a driver circuit for a data line inside a memory, or any other driver circuit for driving a line terminated by a load.

Minimising energy consumption related to data storage and transfer in data-dominated systems is critical for the design of embedded systems. Distributed memory organisations have been proposed as an efficient storage architecture alternative. However, the impact of interconnect overhead in these has traditionally been neglected, which is not acceptable anymore for deep sub-micron technologies.

Trends in miniaturisation and autonomy in future technologies (e.g. bio- and nano-technology) will increase the need for ultra-low power (ULP) systems on chip (SoC) while ensuring reliability of their operation. The most energy/delay critical components in modern SoCs are embedded memories, both for data and instruction/configuration storage. Usually, they use a distributed memory organization consisting of small size SRAM based caches and/or scratch-pad memories for bandwidth and power efficiency. This is especially true for the memories in the first layers of the memory hierarchy (close to the central processor) in low power SoCs.

Currently, state-of-the-art SRAM libraries offer a limited range of energy/delay trade-offs. However, a wider range is important to achieve ULP operation because this range can be exploited during system level exploration to significantly reduce overall system energy.

On the other hand these small size SRAMs become very sensitive to process variability impact due to the higher tolerances of the manufacturing process in the nanometer technology nodes. Indeed, the increasing difficulty in controlling the uniformity of critical process parameters (e.g. doping levels) in the smaller devices makes the electrical properties of such scaled devices much less predictable than in the past. Due to this, the sensitivity of the SRAM circuits, especially the memory cell stability (e.g. signal to noise margin) and the design rules to compensate for this, have gained most attention in industry.

The introduction of design margins to guarantee that the memory still works under all possible conditions is one of the most popular design techniques to guarantee functional and parametric yield. However, as technology scales down the impact of variability increases, hence also the required margin increases, as discussed by R. Heald in "Managing variability in SRAM designs", ISSCC uProcessor Forum, 2004. This overhead becomes prohibitive in the nanometer era and some researchers start proposing run-time monitoring approaches, which characterize the real situation in space and time (see Austin T., Blaauw D., Mudge T., Flautner K. in "Making typical silicon matter with Razor", IEEE Computer, Volume 37, Issue 3, March 2004, pp. 57-65; Nose K., Hirabayashi M., Kawaguchi H., Seongsoo Lee and Sakurai T., "Vth-hopping scheme to reduce subthreshold leakage for low-power processors", IEEE journal of Solid-State Circuits, Volume 37, Issue 3, March 2002, pp. 413-419) and "configure" the module so as to compensate the effects of variability. This requires the introduction of configuration "knobs" in the critical modules to tune the run-time operation of the component when the default configuration mode does not meet the application timing constraints. When, for instance, due to the impact of process variability the default configuration is too slow, a faster configuration (e.g. a lower threshold voltage Vt or higher supply voltage Vdd) can be selected instead.

"Knobs" for functional blocks have been proposed for trade-offs using either supply voltage (Vdd) control techniques, as described by L. Benini and G. De Micheli in "System-level power optimization techniques and tools", ACM Trans. on Design Automation for Embedded Systems (TODAES), Vol. 5, No. 2, pp. 115-192, April 2000, and/or back-gate biasing control (Vt tuning), as described by Nose K., Hirabayashi M., Kawaguchi H., Seongsoo L. and Sakurai T. in "Vth-hopping scheme to reduce subthreshold leakage for low-power processors", IEEE Journal of Solid-State Circuits, Volume 37, Issue 3, March 2002, Pages 413-419, thus allowing dynamic and/or standby energy versus execution time trade-offs. However, as technology scales down the margin available for Vdd and Vt tuning clearly starts decreasing, thus leaving very little margin for delay compensation.

Clearly, these margins are insufficient for compensating process variability impact on delay. This is especially true for SRAMs where delay can drift as much as 40% with most of the samples becoming slower. Hence larger ranges are needed and it is believed by the present inventors that due to the difficulty of controlling the technology process these cannot be provided solely by technology parameter tuning.

SUMMARY OF THE INVENTION

It is an aim of the present invention to provide improved apparatus and methods for electronic circuits, and in particular improved driving circuits suitable for driving lines terminated by a load, such as, for example, data communication busses, within an essentially digital device, as well as the essentially digital or hybrid analog/digital devices including such driving circuits and methods of driving busses.

The above objective is accomplished by a device according to the present invention.

An advantage of the present invention is that it can provide a solution at circuit-level for reducing or minimising energy consumption in drivers to drive a line terminated by a load.

In a first aspect, the present invention provides a driver circuit for driving a line terminated by a load, wherein said driver circuit is configurable for design time selected energy/delay working points. The configuration capability is used, e.g. during run-time, for dynamically selecting a suitable energy/delay working point, given the circumstances wherein said driver circuit has to operate. The driver circuit is in particular targeted for on-chip communication, but is not limited thereto.

The driver circuit may be dynamically configurable, i.e. changeable. In one embodiment, the driver circuit may be dynamically configurable at run-time. Alternatively, the driver circuit may be dynamically configurable at "processing time" and afterwards kept constant at run-time.

The driver circuit according to embodiments of the present invention has driver parameters, and at least one of the driver parameters of the driver circuit may be configurable. Driver parameters may e.g. be gain or number of logic gates in a chain. The driver parameters may be configurable at run-time. The driver circuit may comprise a plurality of logic gates coupled in a chain, wherein said driver parameters include the amount of logic gates involved in the chain. Said logic gates may be inverters.

At least part of said logic gates may be arranged as a chain of logic gates. Furthermore or alternatively, at least part of said logic gates may be arranged in parallel.

The driver circuit may comprise means allowing connection of a variable amount of logic gates to said line. If at least part of said logic gates are arranged as a chain of logic gates, said means allowing connection of a variable amount of logic gates to said line may be adapted for performing a dynamic selection at an end of the chain. Alternatively, said means allowing connection of a variable amount of logic gates to said line may be adapted for performing a dynamic selection within the chain.

The driver circuit may comprise means for allowing connection between logic gates arranged in parallel.

The means for allowing connection may be a circuit with pass transistors. Alternatively, the means for allowing connection may be a circuit within the current path of the logic gate.

A driver circuit according to embodiments of the present invention may comprise a plurality of logic gates and the driver parameters may include the amplification value of at least two of said plurality of logic gates. The driver parameters may also include the voltage swing.

The line driven may be a data communication pathway, e.g. a bus. The data communication pathway may be a segmented bus, and said run-time configurable driver circuit may be adapted for providing optimal operation conditions for at least two different segment configurations.

A driver circuit according to embodiments of the present invention may be adapted for multi-dimensional routing of data.

In a second aspect, the present invention provides an essentially digital device comprising a plurality of resources and an interconnection means between said resources including at least one line terminated by a load, wherein the essentially digital device furthermore comprises a driver circuit according to embodiments of the present invention for driving said line.

In an embodiment of the present invention, the essentially digital device has a segmented bus and said run-time configurable driver may be adapted for providing optimal operation conditions for at least two different segment configurations.

In a further embodiment of the present invention, data transfers are performed within said essentially digital device between source resources and destination resources during scheduling intervals for said transfers. At least one line temporarily facilitates two transfers with partially overlapping scheduling intervals, said line comprising a switch defining segments within said line. The essentially digital device may be characterised in that said run-time configurable driver is capable of providing optimal operating conditions for at least two different segment configurations.

In yet a further embodiment of the present invention, data transfers are performed within said essentially digital device between source resources and destination resources during scheduling intervals for said transfers. At least one line temporarily facilitates two transfers with partially overlapping scheduling intervals, said line comprising a switch, defining segments within said line. The essentially digital device may be characterised in that each of said segments have a run-time configurable driver.

A digital device according to embodiments of the present invention, comprising a run-time controller, may be adapted for dynamically selecting parameters of said driver circuit at run-time. Said run-time controller may be integrated with the switch controller. The run-time controller may dynamically select said parameters from a pre-determined set of parameter value groups, each parameter value group uniquely corresponding to an energy consumption by said essentially digital device and a function of execution time of said essentially digital device. The parameter value groups typically have been determined at design time.

In a third aspect, the present invention provides an essentially digital device comprising at least two drivers for driving a line terminated by a load, and a global controller controlling the at least two drivers by dynamically selecting global trade-offs, rather than having the at least two local controllers each dynamically selecting a local trade-off.

In a fourth aspect, the present invention provides an Interconnect to provide data communication between functional elements within an essentially digital processing device, said interconnect comprising at least one configurable driver circuit according to embodiments of the present invention.

In a further aspect, the present invention provides a digital data processing device, comprising:
a first functional element to perform a first data processing function,
a second functional element to perform a second data processing function, and
an interconnect between said first functional element and said second functional element to provide data communication there between,
wherein said interconnect comprises at least one configurable driver circuit according to embodiments of the present invention.

In yet a further aspect, the present invention provides a driver circuit comprising
an input terminal to receive digital input data from a first source,
a plurality of gates, each capable of charging and discharging a node within said driver circuit,
logic circuitry dynamically selectively connecting the charged and discharged node of a first of said dynamic gates either to the input terminal of a second of said dynamic gates or to the output of said driver circuit.

Said logic circuitry may comprise pass transistors.

Said gates may have a first transistor for charging a node within said driver circuit and a second transistor for discharging said node.

In yet another aspect, the present invention provides a run-time controller, adapted for configuring parameters of drivers of embodiments of the present invention at run-time. The run-time controller may comprise a storage means for storing pre-determined energy/delay working points, the energy/delay working points being pre-determined at design time. The run-time controller may furthermore comprise a means for dynamically selecting, based on an external request, a stored working point. Different working points are stored during design-time. The run-time controller may furthermore comprise circuitry for generating steering signals for input and output logic, e.g. pass transistors or other logic configurations, in accordance with the dynamically selected working point.

In still another aspect, the present invention provides a method for determining a global boundary enveloping curve, e.g. a Pareto curve for an N-stage buffer chain, the method comprising:

building a family of local boundary enveloping curves, e.g. Pareto curves, for a N-1 sub-buffer chain with the sizing factor fN of the N-th stage as a parameter, and determining the global boundary enveloping curve, e.g. a global Pareto curve, as the envelope of the built family of local boundary enveloping curves, e.g. of local Pareto curves. To generate the boundary enveloping curve in any of the examples of the invention, a plurality of combinations of a first parameter and a second parameter is made, the combinations of first and second parameters defining operating points of an electronic device, the combinations belonging to a trade-off set, wherein for any one combination of parameters for an operating point, all other combinations of parameters for all other operating points in the trade-off set having a value of the first parameter which is less favourable than the value for the one combination, have a value for the second parameter which is more favourable than the value of the second parameter of the one combination, and all other combinations of printing parameters for all other operating points in the first trade-off set having a value of the first parameter which is more favourable than the value for the one combination, have a value for the second parameter which is less favourable than the value of the second parameter for the one combination. Parameters relevant in embodiments of the present invention are access time, e.g. a delay in accessing a functional electronic unit such as a memory, or a delay along a bus or other communication line, or energy consumption, e.g. of a line driver. For example, in embodiments of the present invention more favourable means a shorter access time or delay, or alternatively a lower energy consumption.

Building a family of local boundary enveloping curves, e.g. Pareto curves may comprise varying the sizing factor $f_N$ of the N-th stage.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 6b shows a trade-off curve corresponding to the circuit of FIG. 6a.

Figure 1A:
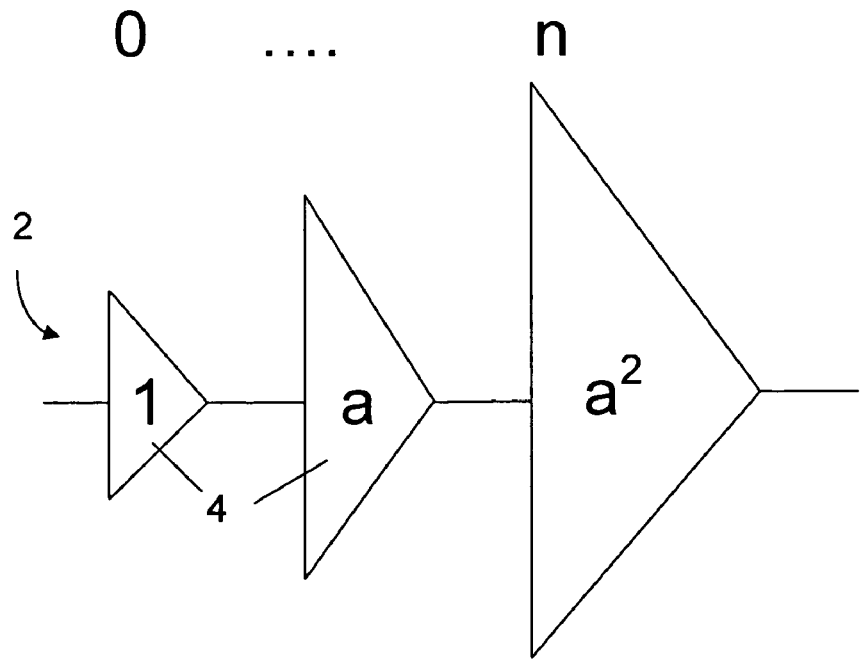
FIG. 1a shows a driver circuit architecture with a chain of inverters.

In the different drawings, the same reference signs refer to the same or analogous elements.

DESCRIPTION OF ILLUSTRATIVE EMBODIMENTS

The present invention will be described with respect to and by means of a detailed description of particular embodiments of the invention, and with reference to certain drawings, but the invention is not limited thereto but only by the claims. It is clear that other embodiments of the invention can be configured according to the knowledge of persons skilled in the art without departing from the true spirit or technical teaching of the invention, the invention being limited only by the terms of the appended claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The present invention relates to essentially digital devices, more particularly to drivers thereof for driving a line terminated by a load. According to an aspect of the present invention, the driver is configurable at run-time, e.g. driver parameters are changed at run-time, so as to dynamically select a suitable energy/delay working point given the circumstance wherein the driver has to operate.

Within essentially digital devices several functional elements or resources, such as e.g. memories and processors, can be identified. Said resources are at least partly connected via interconnection means, i.e. lines terminated by a load, like busses. Putting data on said lines is done via driving of the lines using so-called drivers, also denoted buffers. Hence said interconnection means provides data communication between functional elements (resources) within an essentially digital device such as e.g. a digital processing device.

Typically the parameters of such drivers are fixed while designing said digital device. Said parameters are determined in order to be capable of handling worst-case conditions.

The physical design step results in a plurality of line segments, e.g. bus segments, being provided. For each of the line segments, e.g. bus segments, resulting from the physical design step a buffer must be allocated to drive the associated load. This is a non-negligible source of energy dissipation. Well-known buffer sizing techniques exist, which determine the size of these buffers depending on the timing constraints that have to be met. The faster the line, needs to be, the larger the required buffers and vice versa. But the larger a buffer is, the more energy it consumes. Thus, a trade-off clearly exists between the energy consumption and the delay of the line, and choices in this trade-off may be made by changing the buffer sizes.

Since the timing constraint for the communication network cannot be determined upfront, according to the present invention several potential buffer implementations for a range of timing constraints will be collected for each wire segment for exploration purposes. These will finally be implemented in a configurable way, e.g. a run-time configurable way, using appropriate circuit level configuration techniques for a dynamic selection of the explored possibilities, these possibilities being explored at design-time.

In a first example, such line terminated by a load is a data communication pathway, e.g. a bus.

It is an aspect of the invention to provide a run-time configurable driver for driving such busses, meaning that at least part of its parameters can be changed during run-time.

Figure 1B:
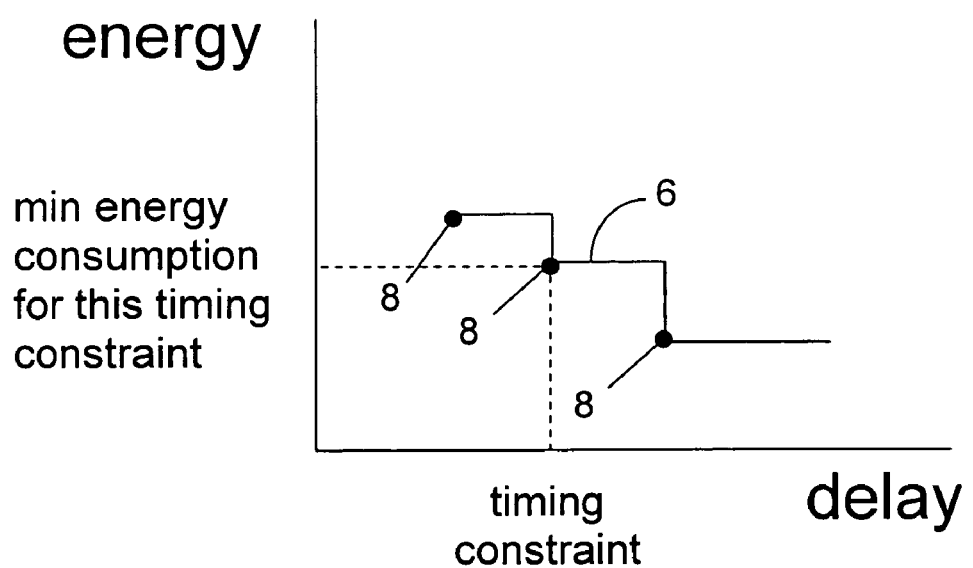
FIG. 1b shows a Pareto-optimal trade-off curve of various working or operating points in terms of energy and delay.

In a first embodiment of this aspect, the driver is a buffer configuration implemented as a chain of inverters 4 with a given set of parameters: amplification factor a, and number n of inverters 4 in the chain 2, see FIG. 1a. The parameter "a" is the amplification factor or how much larger is a given inverter 4 compared to the previous one in the chain 2 of inverters. The parameter "n" is the number of inverters 4 in the chain 2. It is to be noted that n=3 means that there are a total of 4 inverters, the first is the zeroth inverter of minimum size. According to an embodiment of the present invention, at least part of the amplification factors of the individual inverters can be individually changed at run-time. It is shown, see FIG. 1b, that by varying the amplification factor parameter a and the amount n of inverters in the chain, various working or operating points in terms of energy and delay are found on a trade-off curve. It is to be noted that varying said parameters also gives non-optimal points (i.e. points which are illustration of a larger delay for a same energy consumption, or points which are illustration of a larger energy consumption for a same delay, laying on the curve 6), which are preferably neglected. When selecting only optimal points 8, i.e. the points which have a minimum delay for a certain energy consumption, or points which have a minimum energy consumption for a certain delay, as indicated by black circles in FIG. 1b, a convex, boundary envelope is defined, e.g. a so-called Pareto-Optimal trade-off curve. Convex boundary enveloping curves are derived from Pareto curves but are more general. Methods of derivation of such curves are defined in standard works, e.g. "Data Envelopment Analysis", ed. A. Charnes, W. Cooper, A. Y. Lewin, L. M. Saiford, Kluwer Academic, 1994. Such boundary curves define points which lie on or close to the boundary between practical or possible solutions and impossible or impractical solutions for the specific application, method or device being considered. Each point represents a trade-off—it will have some advantages and some disadvantages, hence the curves may be described as boundary trade-off curves. Note that the curves do not need to be continuous, they can be piece-wise continuous. The reason is that there need not be any practical solutions at all between points, or not at every point—this is not a requirement. In any of the examples of the invention a plurality of combinations of a first parameter and a second parameter is made, the combinations of first and second parameters defining operating points of an electronic device, the combinations belonging to a trade-off set, wherein for any one combination of parameters for an operating point, all other combinations of parameters for all other operating points in the trade-off set having a value of the first parameter which is less favourable than the value for the one combination, have a value for the second parameter which is more favourable than the value of the second parameter of the one combination, and all other combinations of printing parameters for all other operating points in the first trade-off set having a value of the first parameter which is more favourable than the value for the one combination, have a value for the second parameter which is less favourable than the value of the second parameter for the one combination. In the present invention the parameters relate to parameters of drivers in electronic devices and the operating points relate to operations of drivers. As an example: the first and second parameters can be a timing constraint and an energy consumption for driving a given load terminating a line if this timing constraint is met.

Alternatively, embodiments wherein said buffer configuration comprises parallel inverters or parallel chains of inverters, with possibly interconnections between said chains, even a complete mesh of inverters, can be used. These embodiments are illustrated in FIGS. 3 to 11, and are described more in detail hereinbelow.

It is clear that instead of invertors other logic gates can be used as basic components in the driver according to embodiments of the present invention.

In a second embodiment of this aspect, a run-time trade-off or Pareto driver or buffer is provided, being a buffer configuration that achieves boundary values of a first and a second parameter, e.g. a timing constraint with the lowest possible energy consumption for the given load that has to be driven and this for a feasible range of possible timing constraints which can be selected at run-time. This is illustrated by means of FIG. 1b. During design time, a set of energy/delay working points 8 is determined. The points may lie on or close to a convex boundary enveloping curve, e.g. a Pareto curve. During run-time, depending on the load, between the working points 8 in the set an optimal working point is dynamically selected, so that for a pre-determined timing constraint, pre-determined by the load, a minimal energy consumption is used.

In yet another embodiment all said buffer configurations can be made to be a run-time trade off or Pareto driver or buffer.

Figure 2:
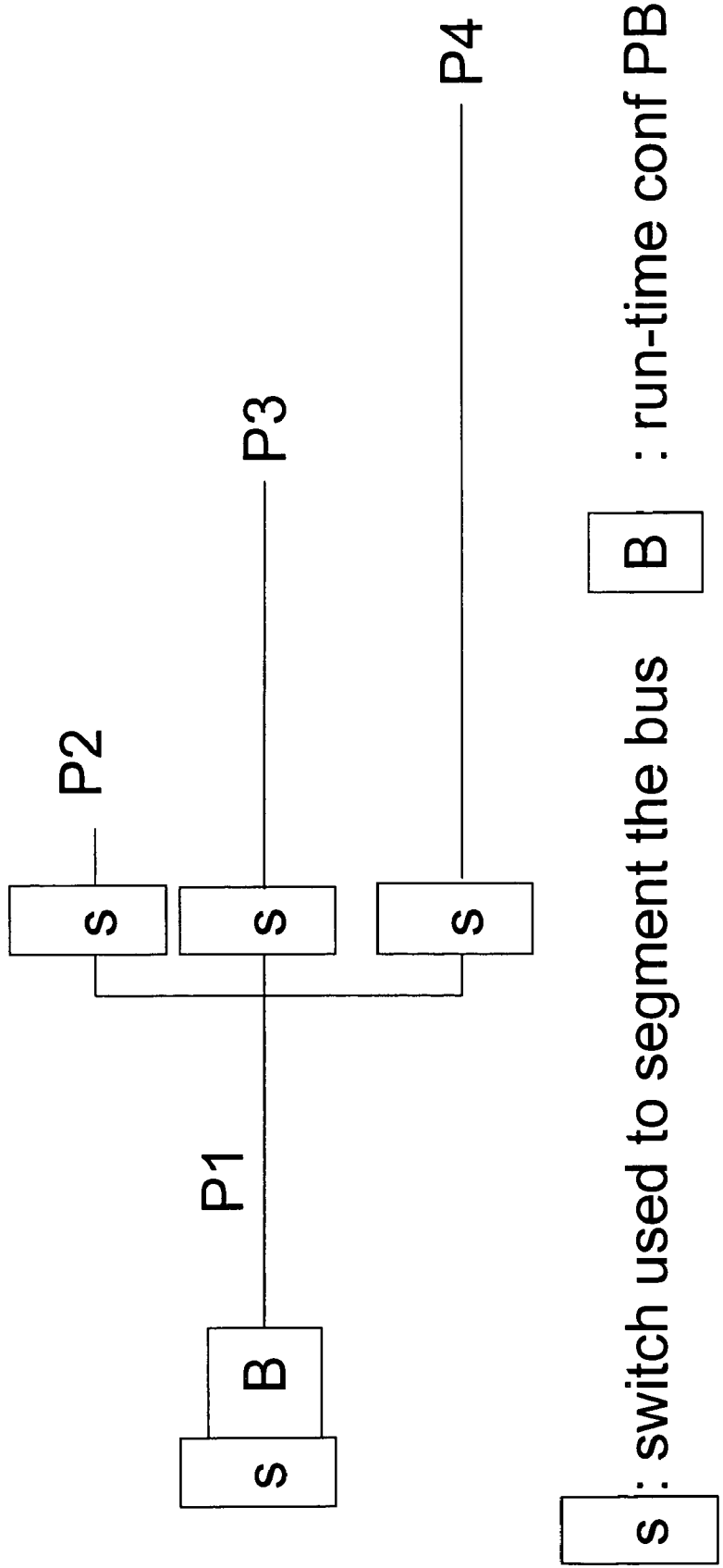
FIG. 2 shows a interconnection means with several bus segments and switches and a run-time configurable bus driver, capable of handling the different bus configurations, defined by opening and closing of said switches. Preferably said driver is a Pareto-Optimal Buffer (PB) or driver.

In a further aspect of the present invention, the run-time configurable buffers are used in a communication network (for instance between memories) containing segments, for instance when using segmented busses P1, P2, P3, P4. This is illustrated in FIG. 2.

Since the capacitive load depends on the length of the segments P1, P2, P3, P4, one can decide to classify the segments according to their lengths and decide to have:

no buffer for very short busses (for instance with a length below 50 μm),
for short segments (for instance with a length between 50 μm and 250 μm) to use two inverter drivers (n=1) with varying gain parameter a,
for large segments (for instance with a length between 250 μm and 2 mm) next to the gain parameter a also the number n of inverters in the driver is varied,
while for very large segments (for instance larger than 2 mm) a further segmentation is applied.

It is clear that the above classification is technology node dependent. The example given above is for a 130 nm technology and for the actual trade-off or Pareto buffer it is found that n=1 and the gain parameter a ranges from 1 to 4 for short segments and for large segments one should dynamically select between two types of trade-off or Pareto buffers, in particular n=1 and gain parameter a ranging from 4 to 10 or n=3 and gain parameter a ranging between 3 and 4.

One may thus conclude that different wire lengths within a wire-range (short/large) can be serviced by the same configurable buffers.

In an embodiment of the invention, having a run-time configurable trade-off optimal, e.g. Pareto-optimal, buffer (PB) allows to use only one buffer no matter which path (P1+P2 or P1+P3 or P1+P4) is actually activated, and this on condition all paths belong to the same wire-range. Based on the path, the buffer configuration decided at design-time is dynamically selected at run-time by configuration bits in the instruction memory hierarchy. Hence the buffer is capable of providing optimal operating conditions for at least two different segment configurations.

In an alternative embodiment thereof for at least two segments such a run-time configurable buffer or driver is provided.

Figure 3:
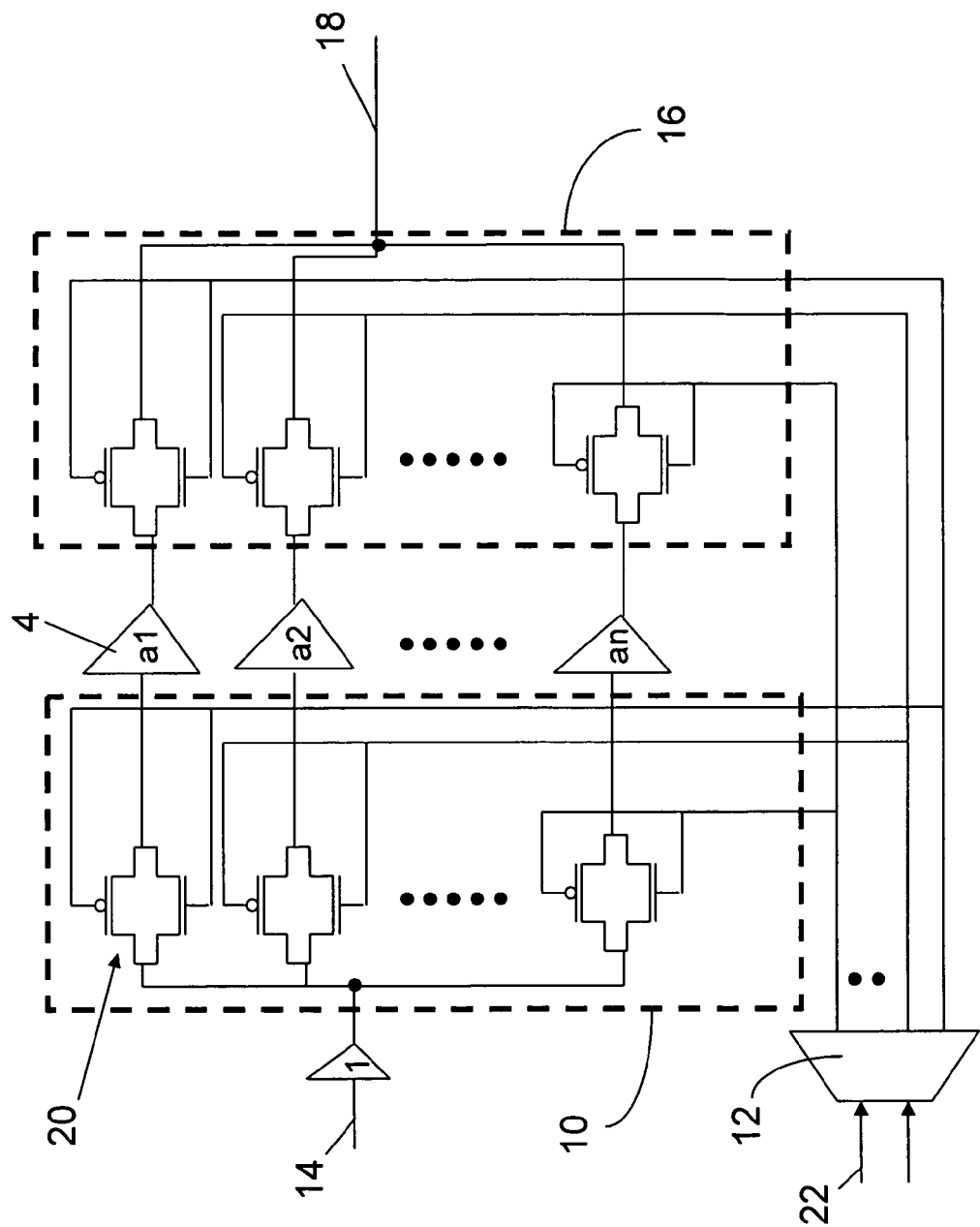
FIG. 3 shows a template for such a configurable driver, in particular parallel inverters and means for input and output selection are shown.

FIG. 3 illustrates a first buffer template. It comprises a plurality of buffers 4 arranged in parallel, each having a different gain factor a1, a2, ..., an. Input select logic 10 is provided, driven by a control line demultiplexer 12 adapted for dynamically selecting the most appropriate buffer, i.e. the buffer with the most appropriate gain factor, in view of the current circumstances. The input signal presented on a signal input node 14 will then, via the input select logic 10, over the most appropriate buffer, be transferred to output select logic 16 driven by the same control line demultiplexer 12, and so to a signal output node 18. The input select logic 10 and the output select logic 16 in the example illustrated in FIG. 3 comprise a plurality of pass transistors 20 driven by the control line demultiplexer 12 for dynamic selection of the most appropriate buffer 4.

Figure 4:
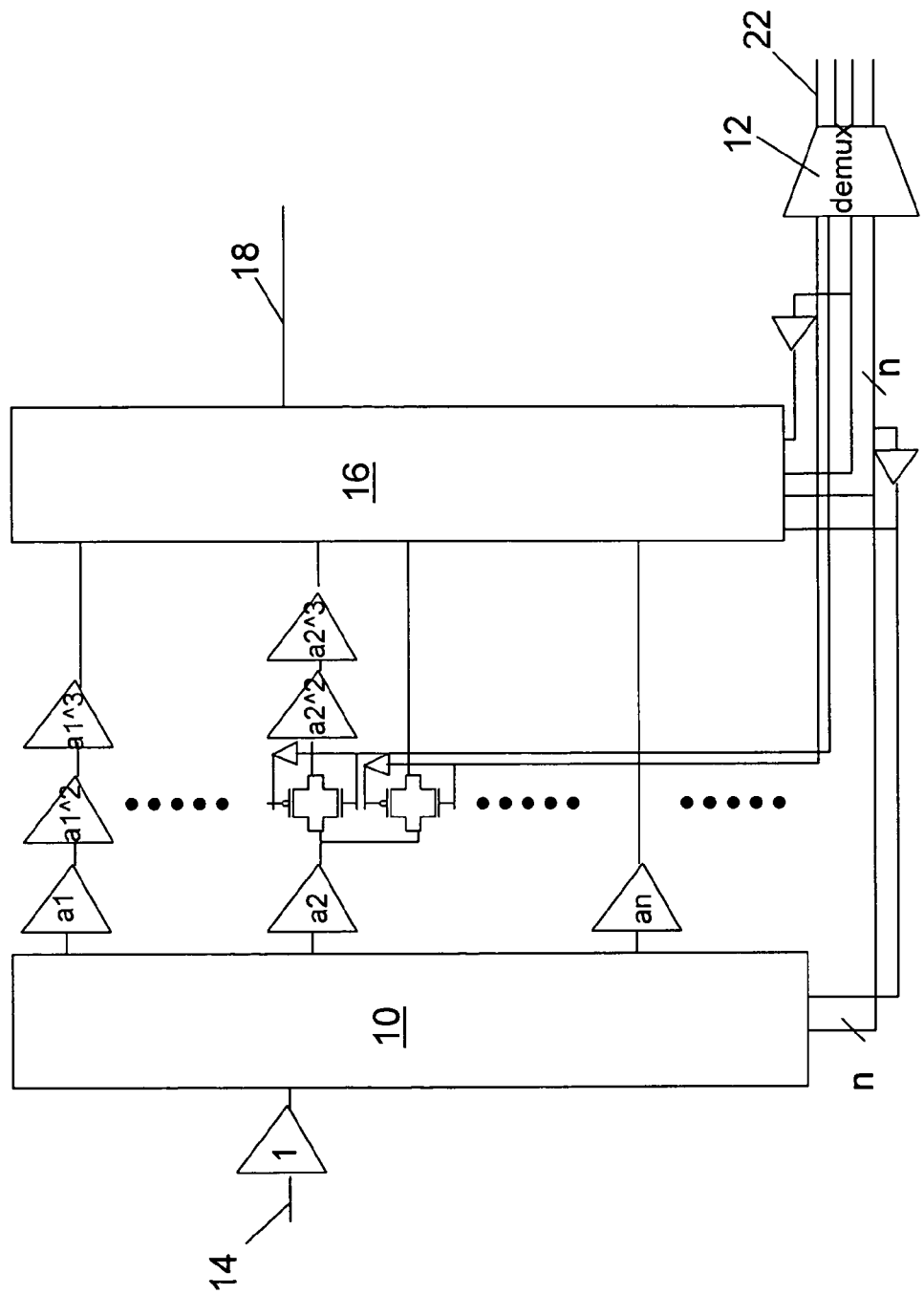
FIG. 4 further elaborates on the template of FIG. 3, and shows parallel chains with different length and means, here pass transistors, for having chains of variable lengths connected to the output.

FIG. 4 describes another buffer template, with parallel chains of inverters. Different chains of inverters comprise inverters with a different gain factor. Furthermore, in a chain of inverters means may be provided for switching on or off further inverters. This makes not only the gain factor of the buffers dynamically selectable, i.e. by selecting which chain to make active, but also the number of inverters in a chain.

It is to be noted that in both templates the output select logic 16 can be omitted if the inverters 4 provide tri-state output (this depends on circuit implementation).

The de-muxing of the input control lines 22 can be done either close to the buffer side (as shown in FIGS. 3 and 4) or close to the local buffer that stores the control signal (not illustrated in the drawings). In the first case the buffer implementation is more costly, in the second case more lines need to be routed from the local buffer to the buffer.

FIGS. 5a, 5b and FIGS. 6a, 6b show two case studies.

Figure 5A:
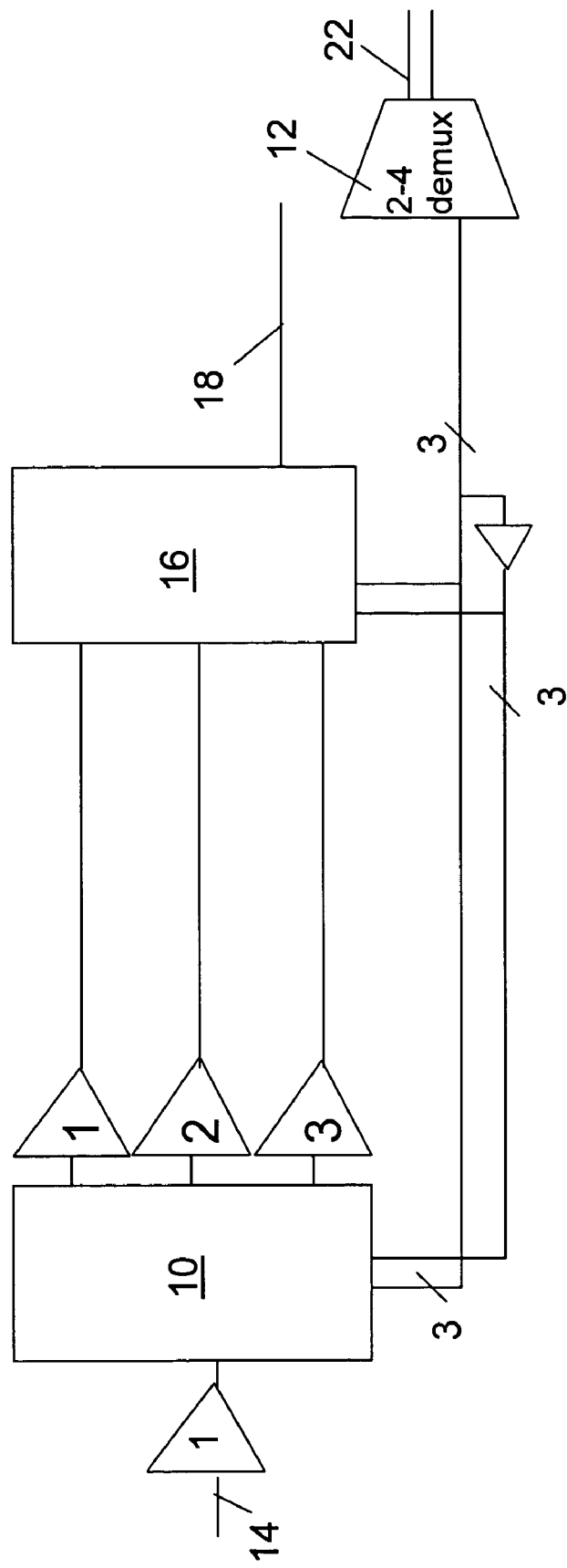
FIG. 5a shows an example with three parallel inverters.
Figure 5B:
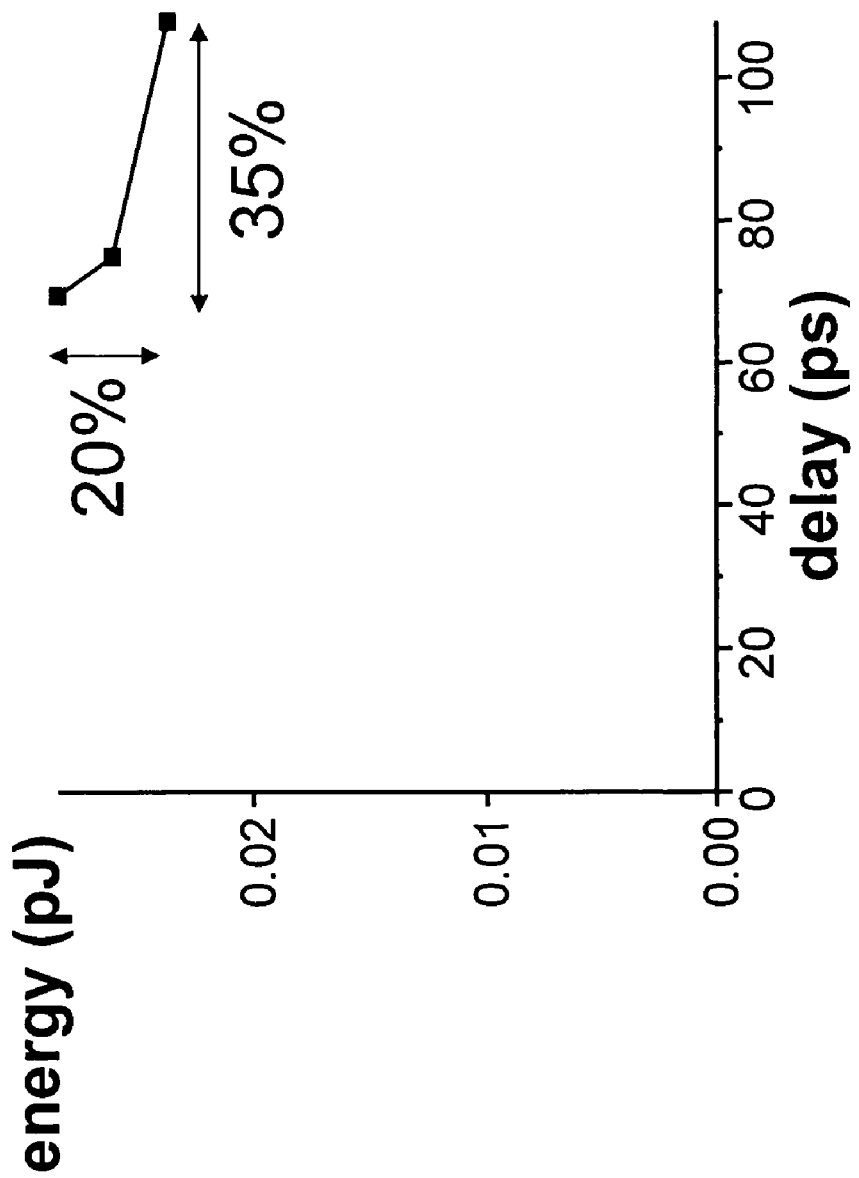
FIG. 5b shows a corresponding three-point trade-off curve.

FIG. 5a is a run-time configurable buffer for a short wire length (50 μm). Three parallel buffers 4 are provided, with respective gain factors 1, 2 and 3. Input control lines 22 are demultiplexed and these demultiplexed signals are applied to both input select logic 10 and output select logic 16 for dynamic selection of the most optimised buffer 4. An area estimate for FIG. 5a is 14 minimum size inverters. FIG. 5b shows a trade-off curve for the buffer of FIG. 5a with three working points. There is a difference of 35% between the working point with lowest and the one with highest delay. There is a difference of 20% between the working point with smallest and the working point with highest energy consumption.

Figure 6A:
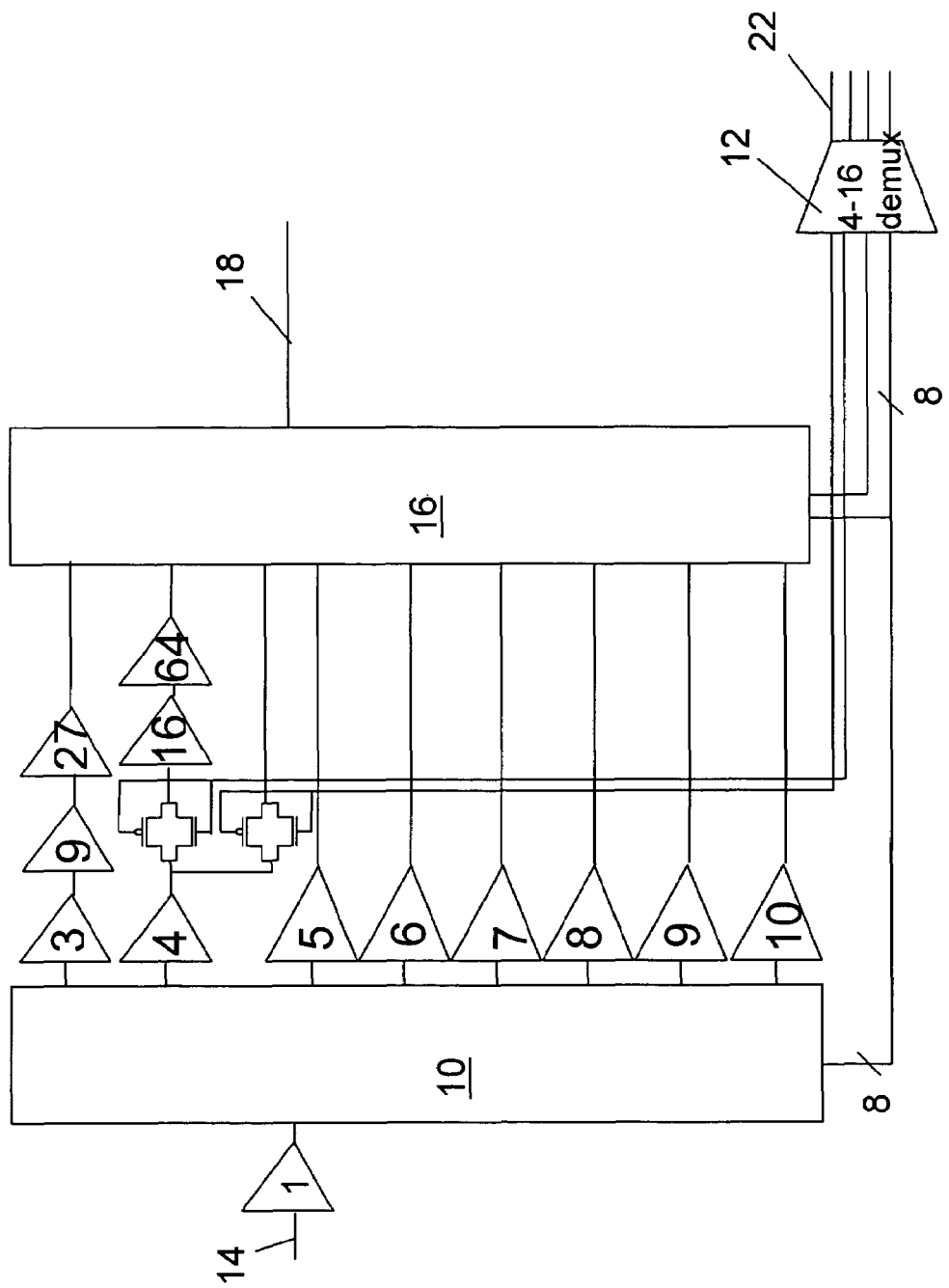
FIG. 6a gives another example with a plurality of parallel chains, some of those chains comprising means, here pass transistors, for having chains of variable lengths connected to the output.
Figure 6B:
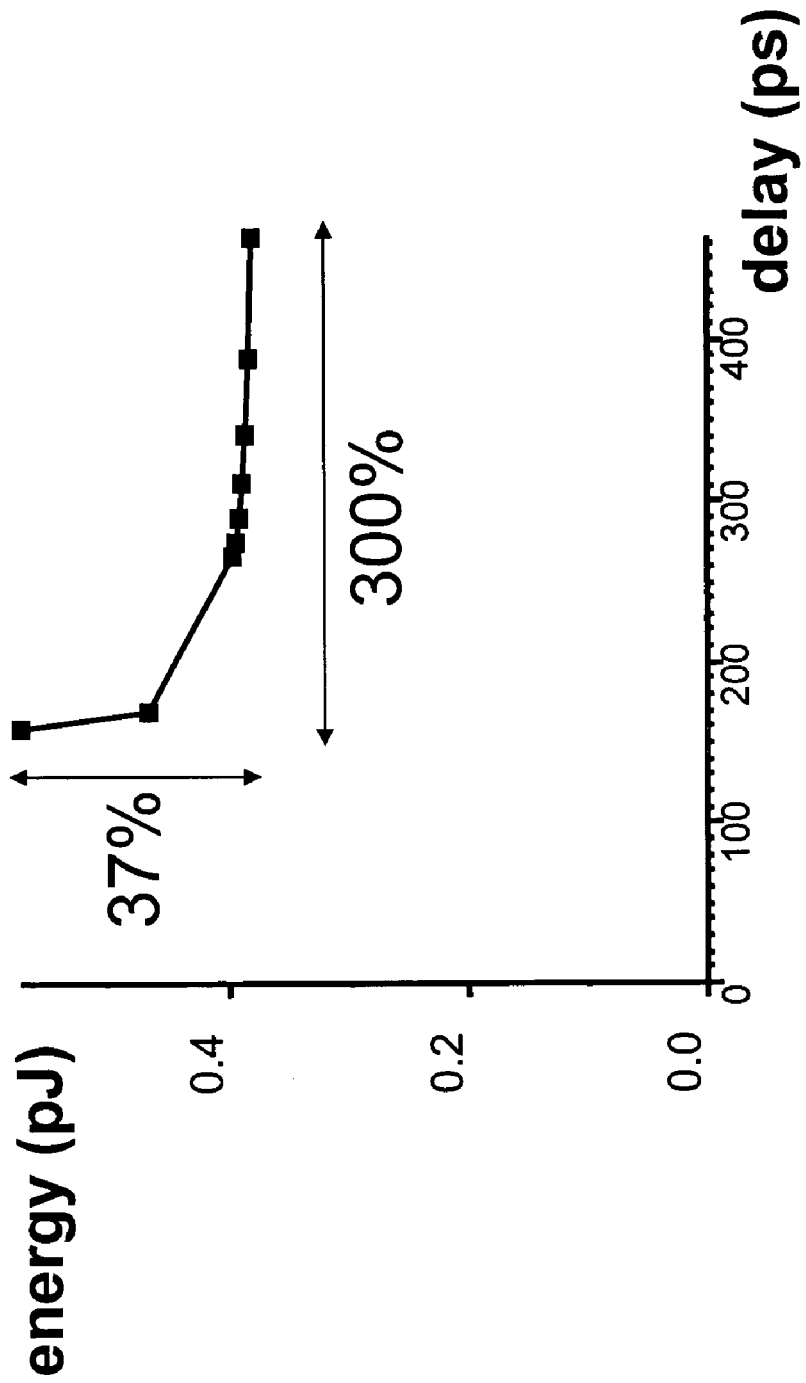

FIG. 6a shows a run-time configurable buffer for a large wire length (1 mm). Eight parallel chains of buffers are provided. A first chain comprises a sequence of three buffers, with respective gain factors 3, 9 and 27. A second chain also comprises a sequence of three buffers, with respective gain factors 4, 16 and 64. The buffers with gain factors 16 and 64 can be switched off. The other chains each comprise one buffer, the buffers having gain factors ranging from 5 to 10. An area estimate for FIG. 6a is 175 minimum size inverters. FIG. 6b shows a trade-off curve for the buffer of FIG. 6a. There is a difference of 300% between the working point with lowest and the one with highest delay. There is a difference of 37% between the working point with smallest and the working point with highest energy consumption.

Figure 7:
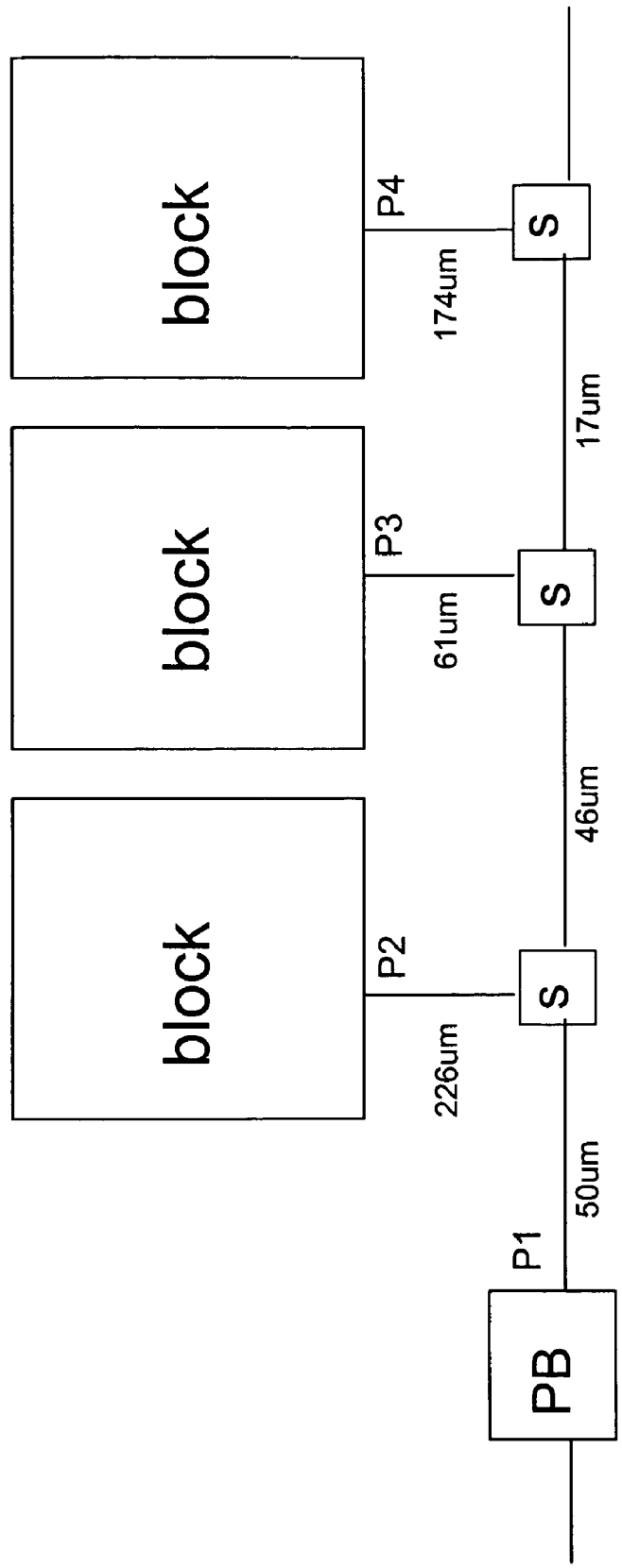
FIG. 7 shows a set-up wherein drivers according to the present invention operate, with different blocks or resources, connected to each other by means of a segmented bus (with switches).

FIG. 7 shows a resource set-up, wherein different paths need to be driven from the same PB (P1–P2, P1–P3 or P1–P4) depending on the configuration of the switches S. A plurality of blocks are illustrated that communicate via the bus. Px relates to Point x. S is a segment switch. PB is a trade-off or Pareto buffer. As can be seen from FIG. 7, the bus distance from a driver PB to a first block is 276 μm, the bus distance from the driver to a second block is 157 μm and the bus distance from a driver to the third block is 287 μm. Depending on which block is to be made active, different working points may be dynamically selected, and thus different driver parameters.

Figure 8A:
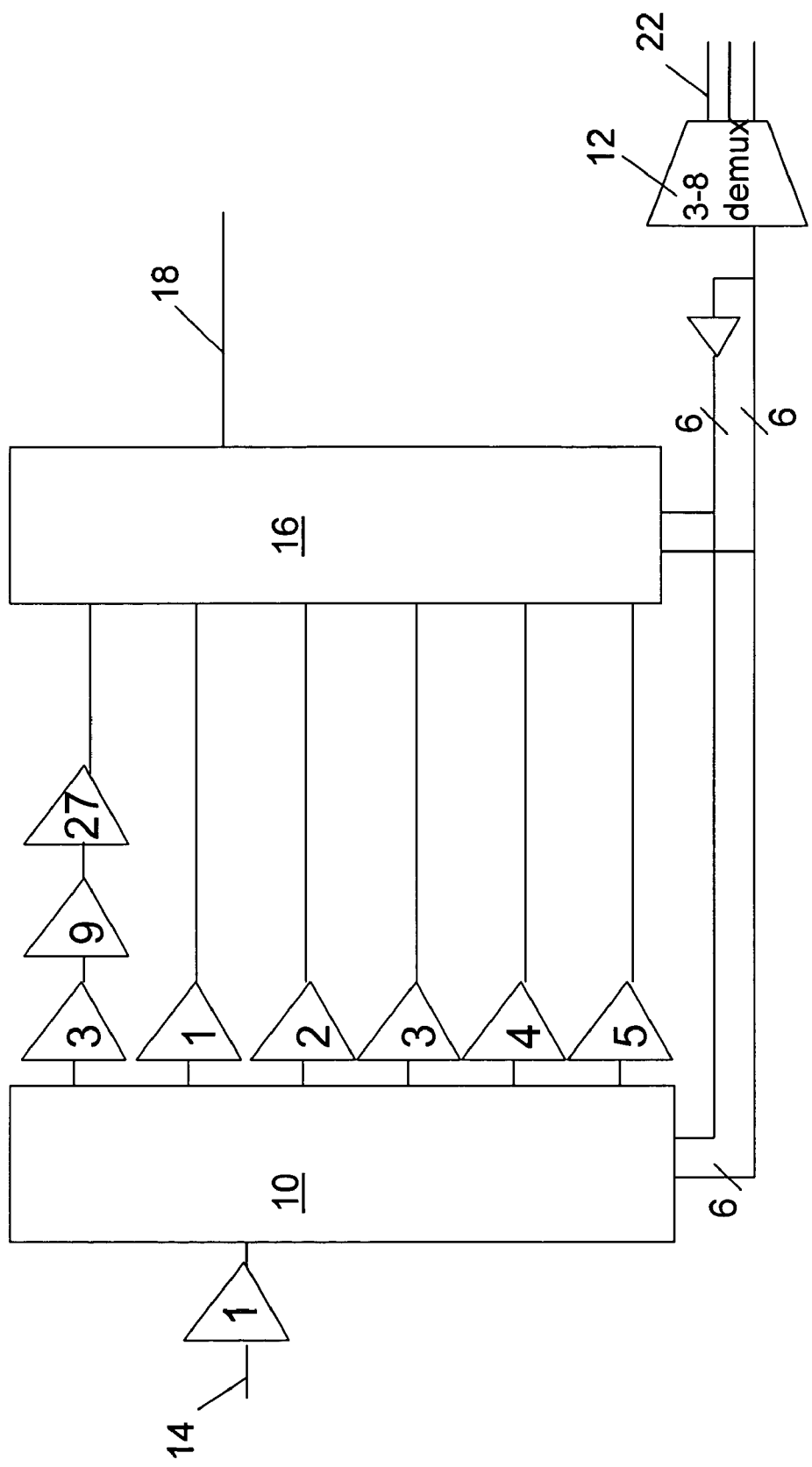
FIGS. 8a, 9a and 10a show the generation of a Pareto-Optimal Buffer for three possible interconnect configurations possible with the set-up of FIG. 7.
Figure 8B:
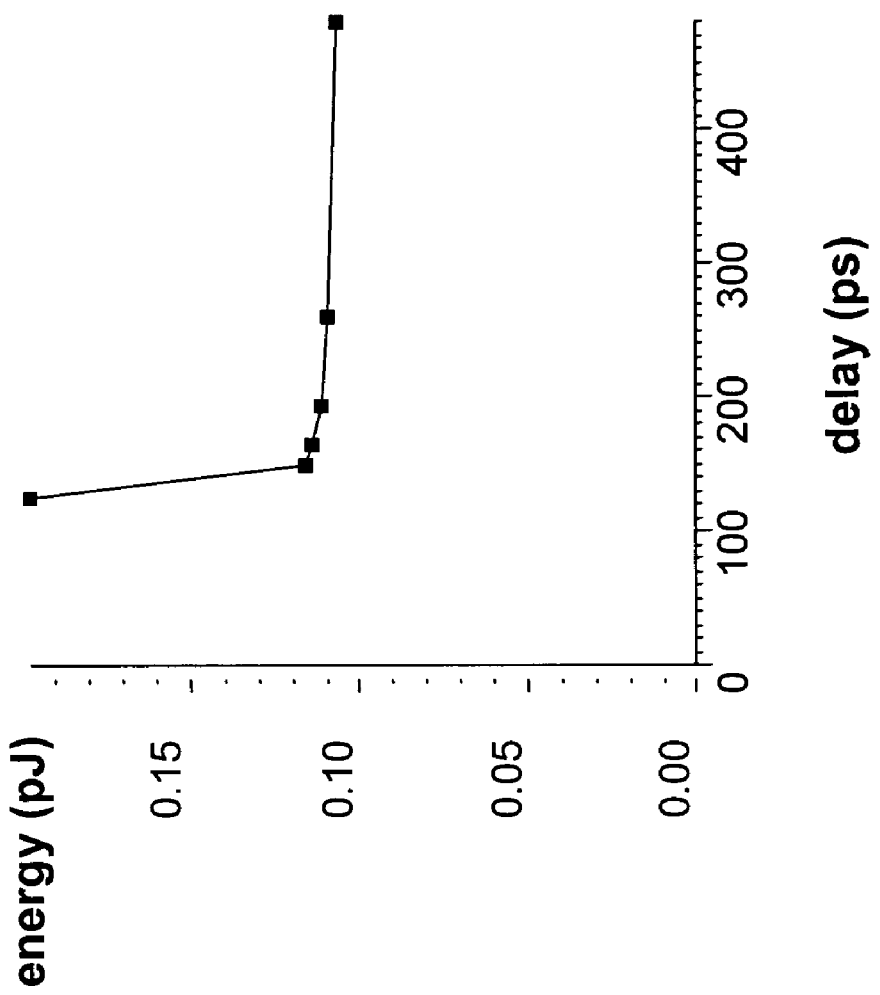
FIGS. 8b, 9b and 10b respectively show corresponding trade-off curves.
Figure 9A:
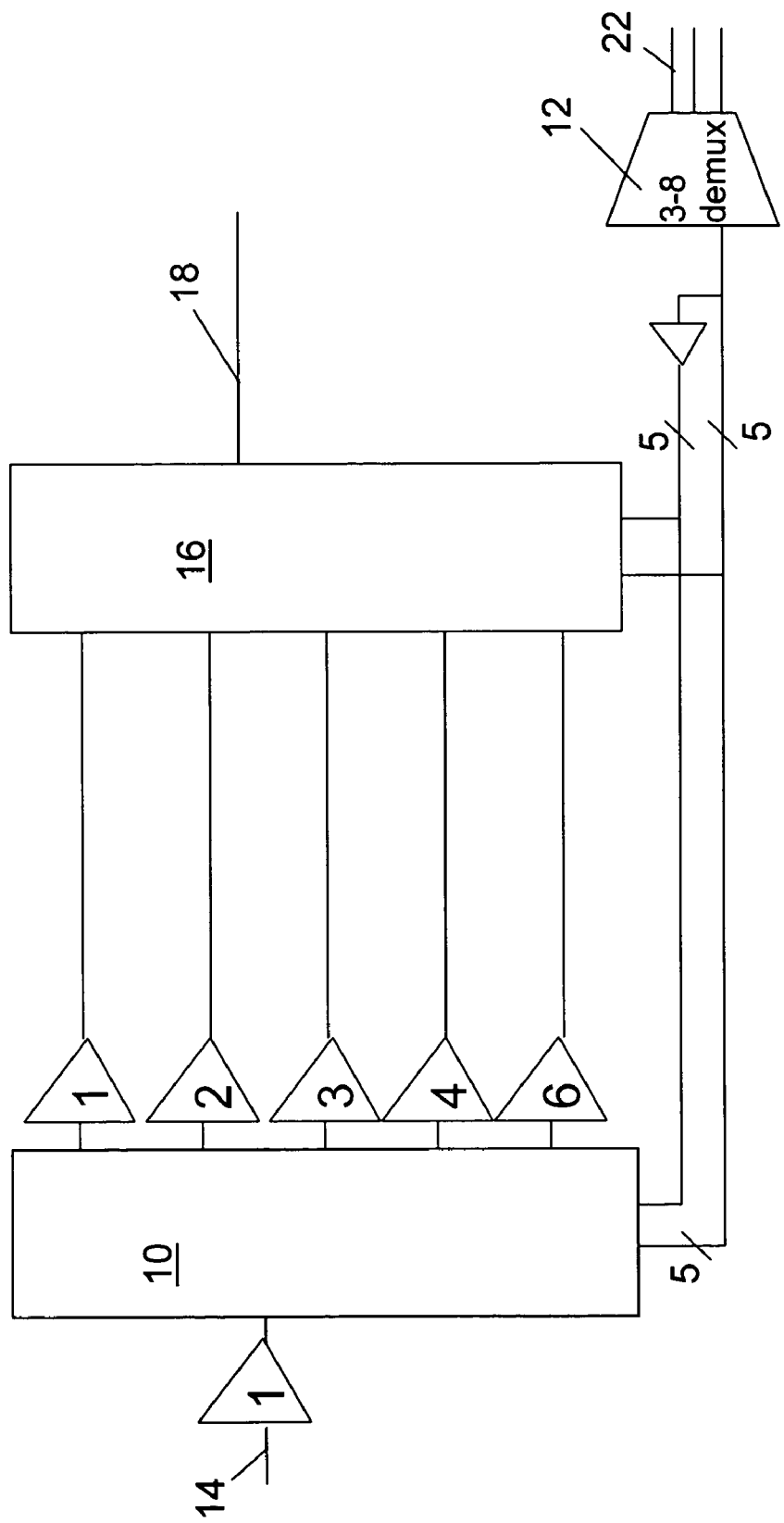
Figure 9B:
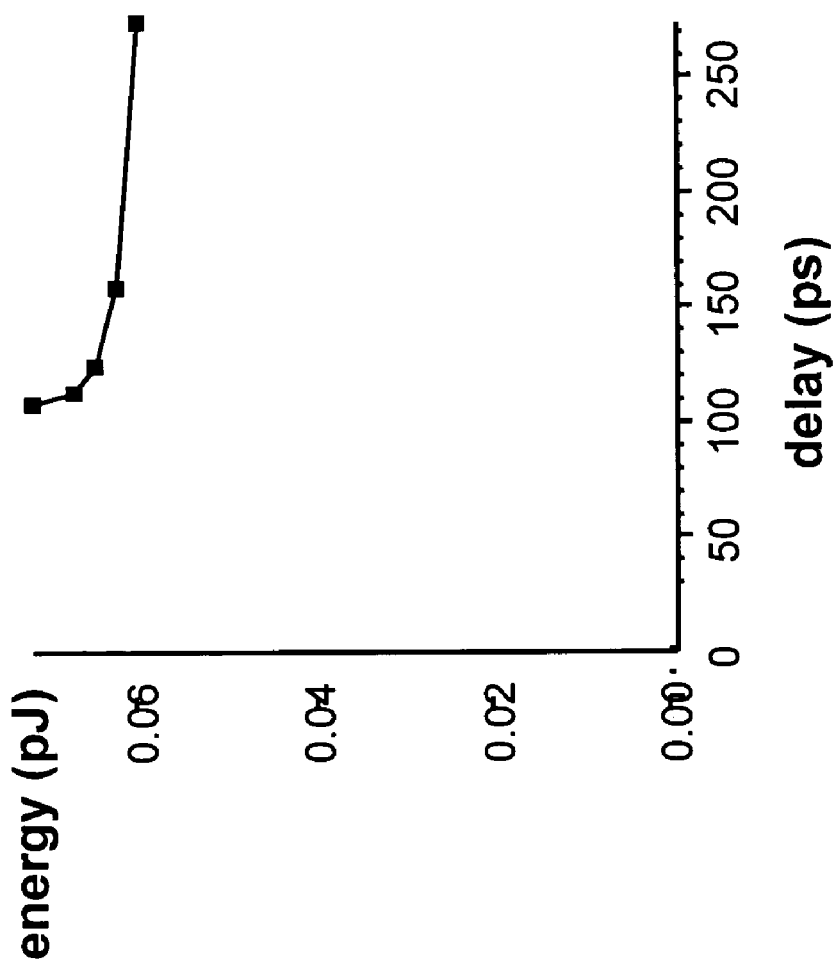
Figure 10A:
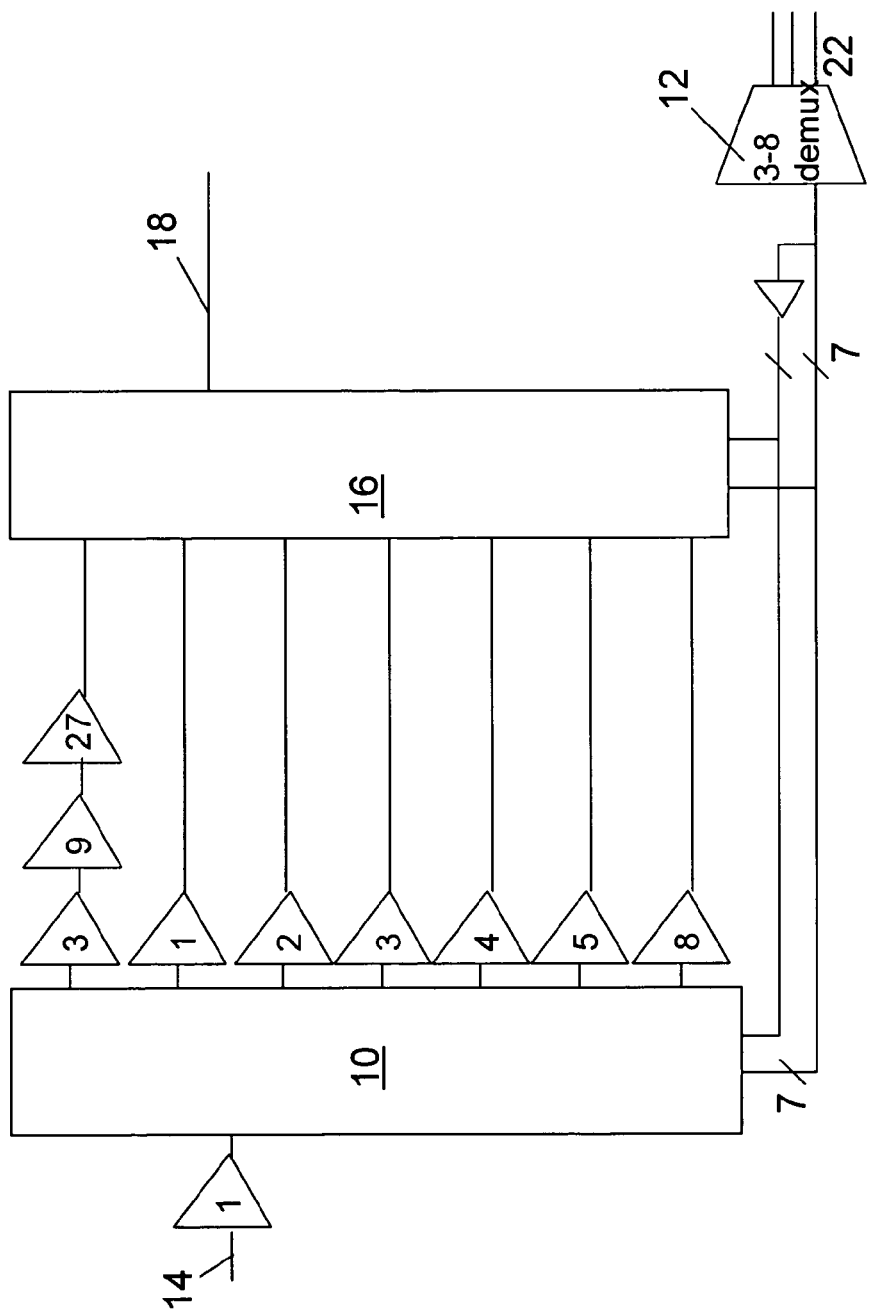
Figure 10B:
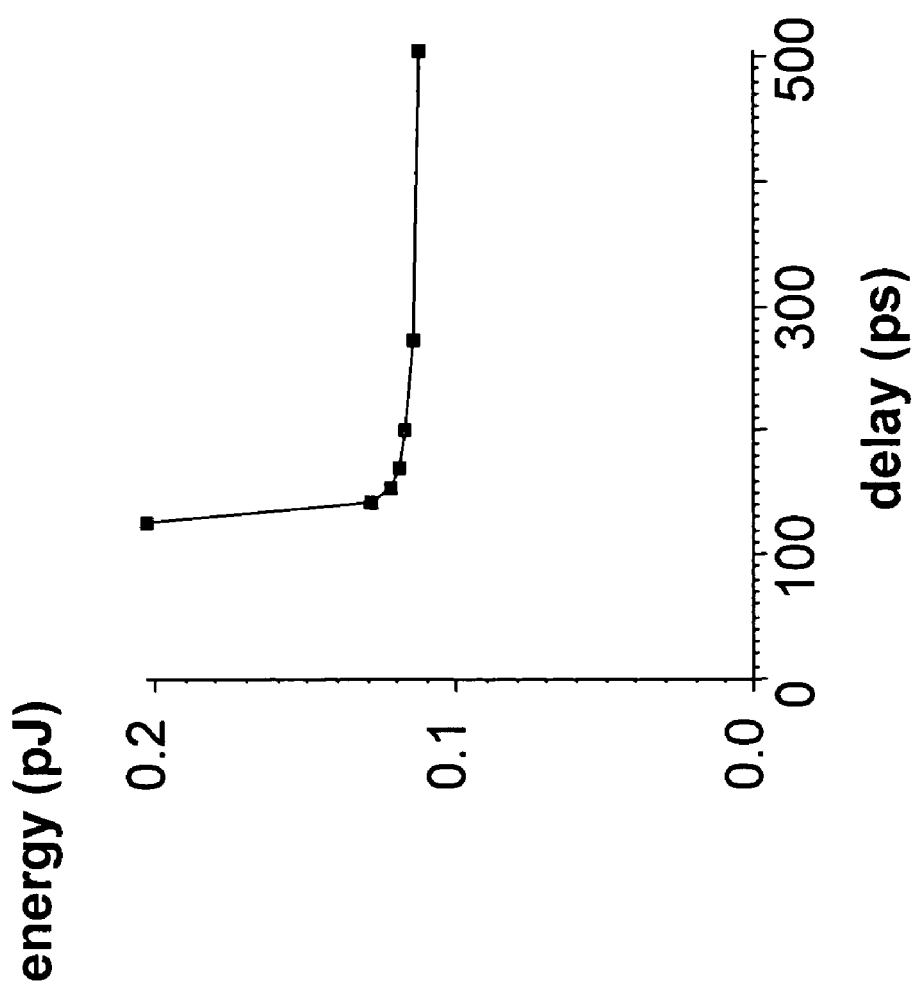

FIGS. 8a, 9a and 10a show the trade-off or Pareto Buffer for each of these paths. Area estimate for FIG. 8a is about 67 minimum size inverters. Area estimate for FIG. 9a is about 28 minimum size inverters. Area estimate for FIG. 10a is about 79 minimum size inverters. FIGS. 8b, 9b and 10b show the corresponding trade-off curves with the dynamically selectable working points.

Figure 11:
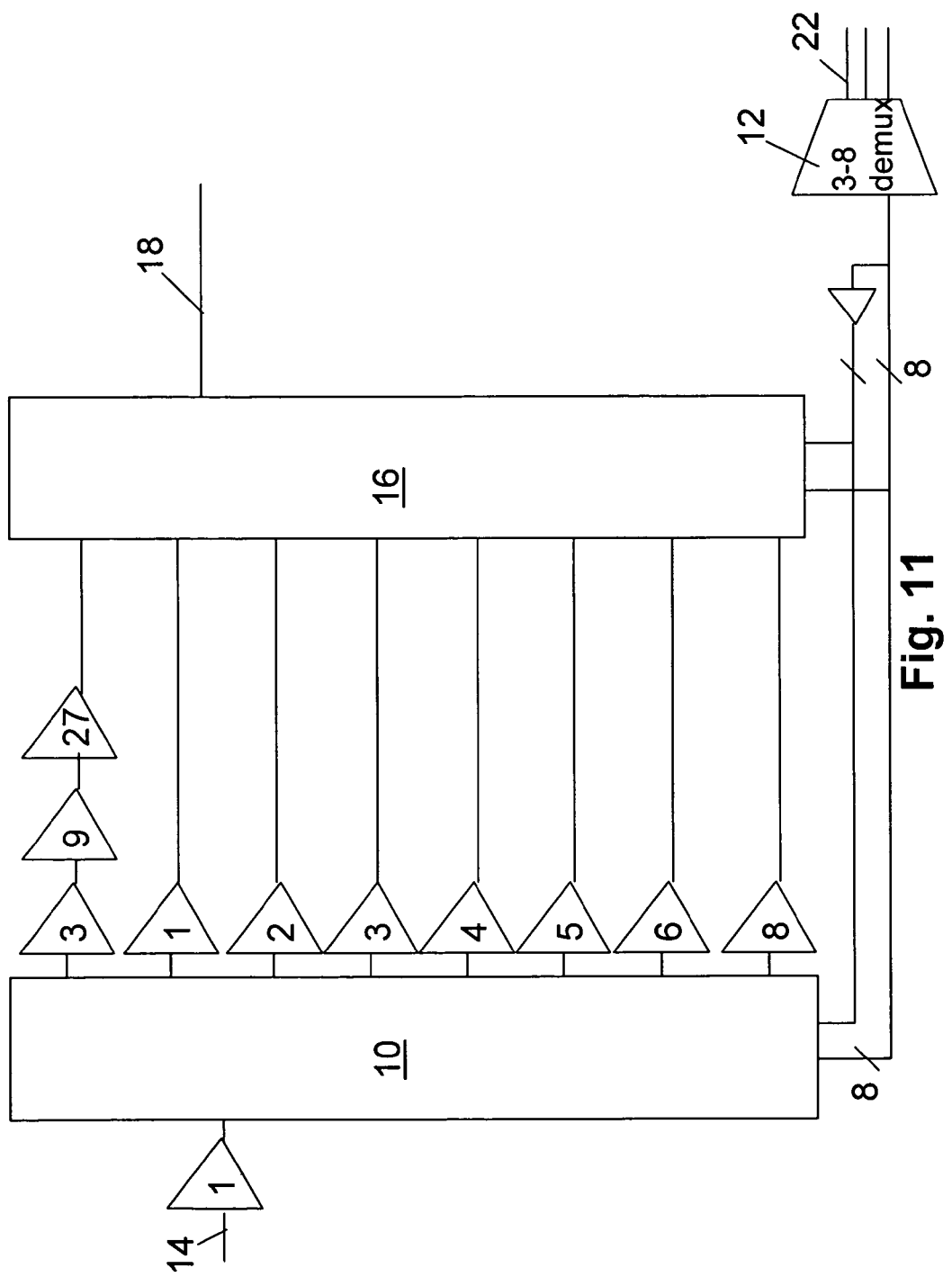
FIG. 11 shows the final Pareto-Optimal Buffer capable of handling all above interconnect configurations.

FIG. 11 shows then the final or combined run-time trade-off or Pareto Buffer, which includes the possibilities of each of the separate trade-off or Pareto Buffers for each of the paths. The combined run-time trade-off or Pareto Buffer can provide all the energy/delay optimal points for multiple paths. If sharing buffer chains between multiple paths saves area, compared to implementing a run-time PB per path/segment, a combined approach, i.e. implementation of the trade-off or Pareto Buffer of FIG. 11, is used. Otherwise a buffer per segment approach is used, i.e. implementation of the trade-off or Pareto Buffers of FIGS. 8a, 9a and 10a.

In the example shown, every wire-length below 300 µm can be handled by the same PB implementation of FIG. 11 (all the small inverter chains are included in the combined run-time trade-off or Pareto Buffer).

The PBs described in the previous figures are uni-directional buffers. To create bidirectional PBs the methodology is similar. Two changes required are as follows:

When determining the PB, the segments at both sides of the PB should be taken into account. "Input" and "output" paths should be considered. The methodology to build the buffers and the conclusions are similar but more paths should be taken into account.

Figure 12:
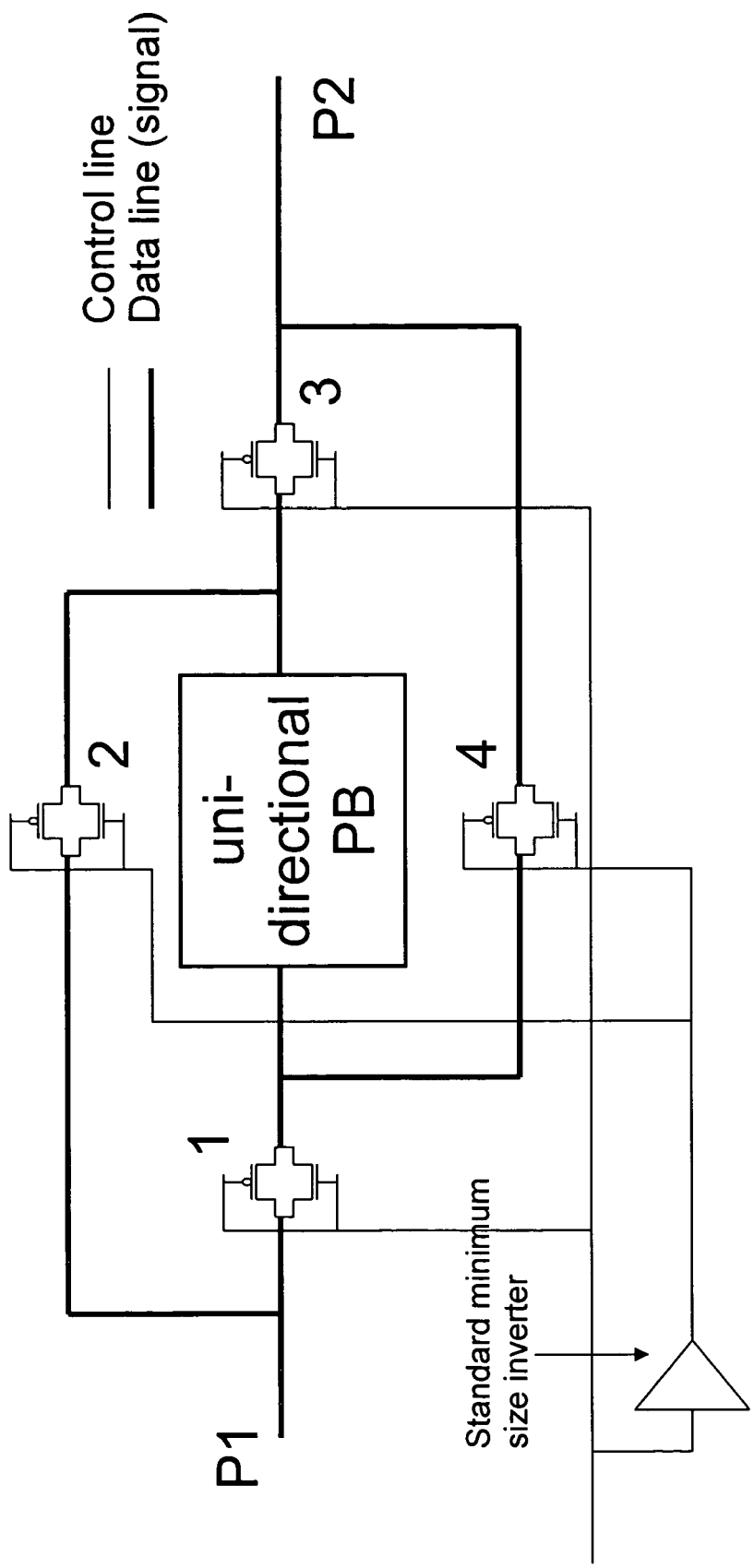
FIG. 12 shows a driver circuit in accordance with the invention, suitable for dealing with bi-directional implementations, the driver circuit having pass transistors.

Additional control circuitry is required in order to use the same buffer to drive the segments of both directions (see FIG. 12). To drive data from P1 to P2 the switches 2 & 4 (implemented as transmission gates) should be electrically open and switches 1 & 3 should be closed. To drive data from P2 to P1 the opposite configuration is required. One control bit is enough for this (for all the wires in the bus). It is to be noted that the control required for the unidirectional PB is still required but not shown here.

Figure 24:
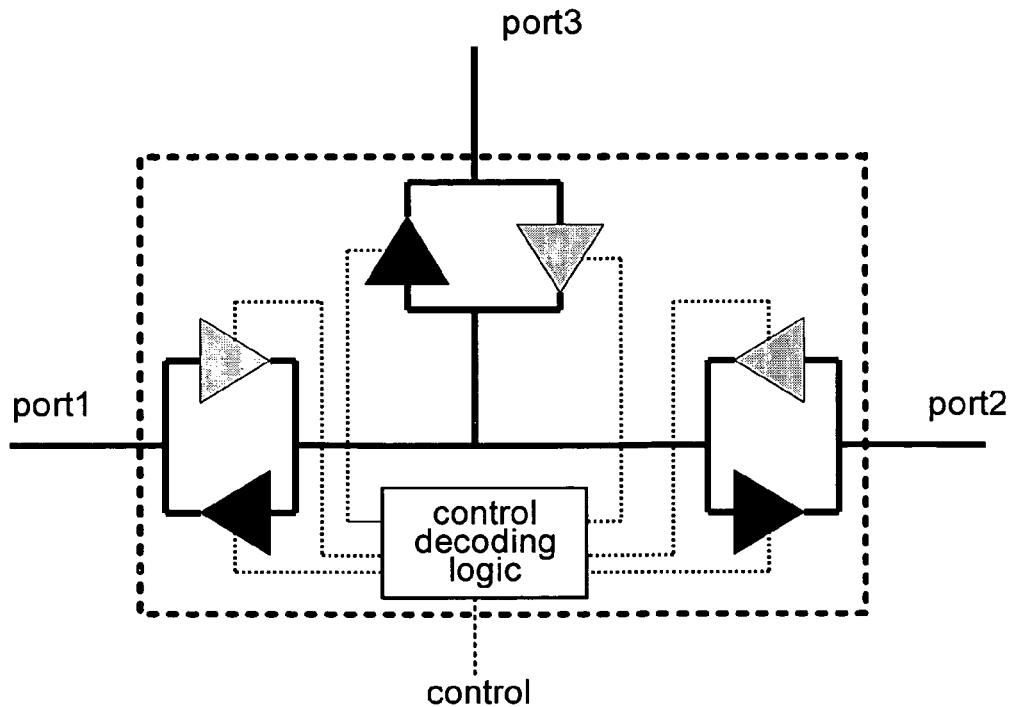
FIG. 24 illustrates an alternative embodiment for the driver circuit of FIG. 12, without pass transistors.

An alternative embodiment of a multi-directional line driver, e.g. a multi-directional bus driver, without pass transistors is provided in FIG. 24. The multi-directional line driver illustrated has three ports: port 1, port 2 and port 3. Data can be transmitted from any port to any other port and back. Each of the ports is connected to a first node of a set of two invertors which are coupled in anti-parallel, the set of two invertors coupled in anti-parallel having a first and a second node. The sets of invertors are all connected to each other with their second node. Of the set of invertors, one invertor is a small one and the other one is a large one. The small one is coupled with its input node to the first node of the set of invertors and with its output node to the second node. The large one is coupled with its output node to the first node of the set of invertors and with its input node to the second node. The invertors are all connected via control paths to control decoding logic, which generates suitable control signals for switching on or off relevant invertors. For example, if data is to be routed from port 2 to port 1, corresponding control signals are generated by the control decoding logic, i.e. control signals to switch off the large invertor near port 2, the small invertor near port 1 and both invertors near port 3, and to switch on the small invertor near port 2 and the large invertor near port 1.

Figure 13:
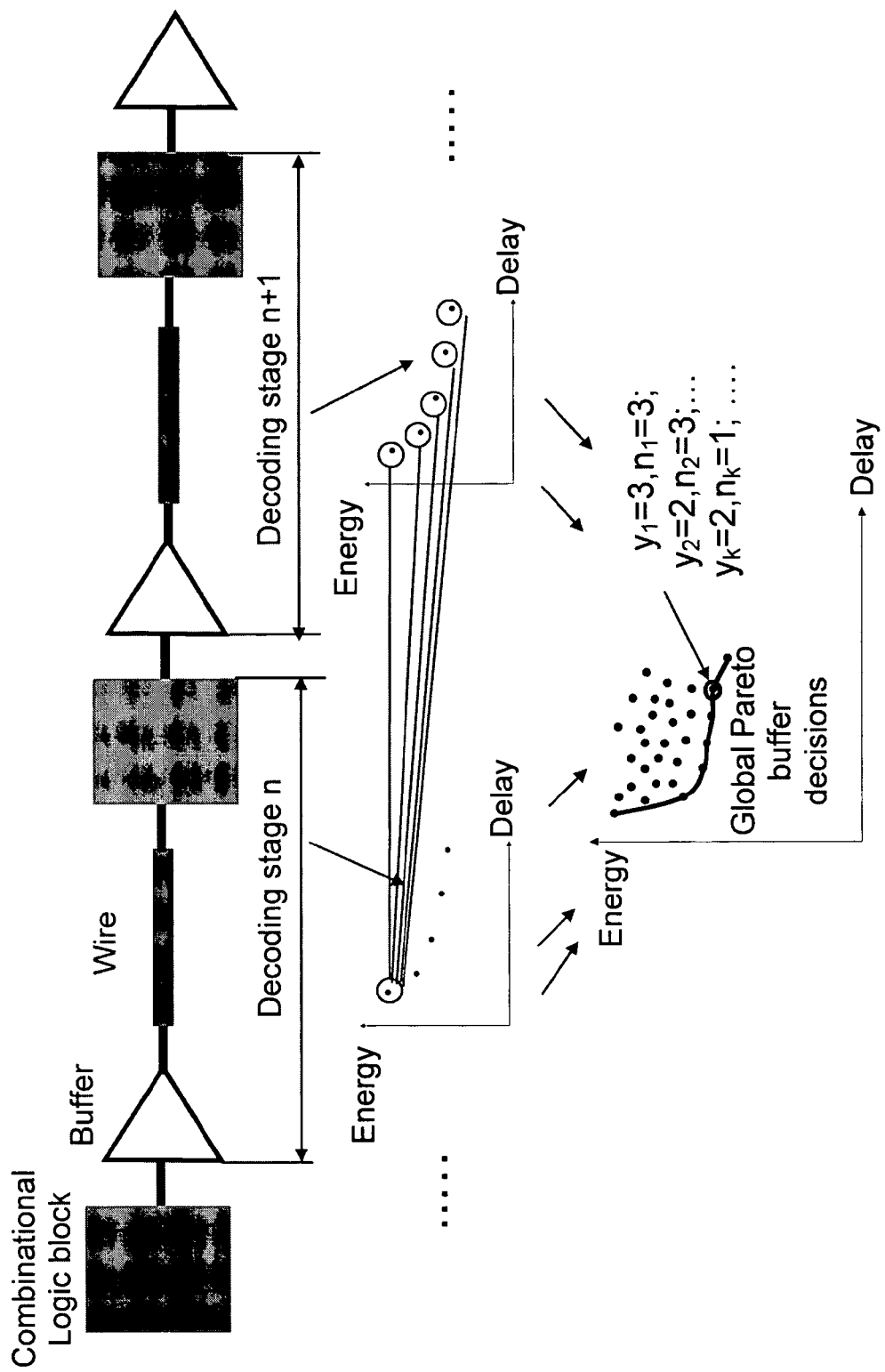
FIG. 13 illustrates two local line drivers, each driving part of a line, as well as a global line driver for refinement of the local driver settings.

In a further aspect of the present invention, an essentially digital device is provided comprising at least two drivers for driving a line terminated by a load. The essentially digital device furthermore comprises a global controller controlling the at least two drivers by selecting global trade-offs. This is illustrated in FIG. 13. A first and a second line are each driven by a buffer, respectively denoted as decoding stage n and decoding stage n+1. Rather than that each of the buffers provides a local trade-off or Pareto buffer decision, the global controller controls the buffers so that a global trade-off or Pareto-optimal solution is obtained. This may include one or more of the buffers not being in its trade-off optimal or Pareto-optimal solution for the given load.

It is a further aspect of the invention to realize that the proposed drivers are usable in any context where "configuration" is useful. It does not need to be run-time configuration actually. It could also be used by an IP vendor that has a parametrisable buffer in his library that is instantiated once at "processing time" and afterwards kept constant at run-time. Alternatively one can specify that said drivers are dynamically configurable which is not necessary run-time neither.

In a second example, the line terminated by a load is a data line, for example inside a memory. The main difference between this example and the embodiments of the example described above is that the dynamic selection is performed not at the end of the chains, but within the chain, by interrupting the current flow in an amplifier transistor pair.

It has been found by the present inventors that providing efficient run-time configuration "knobs" will only be feasible by coupling parameter tuning techniques to circuit level trade-offs and not solely, as in the prior art, via technology tuning, e.g. selection of a lower threshold voltage Vt or a higher supply voltage Vdd. Moreover, providing run-time trade-offs via technology tuning for SRAMs is becoming very difficult due to the sensitivity of the memory cell operation to technological parameters.

Figure 14:
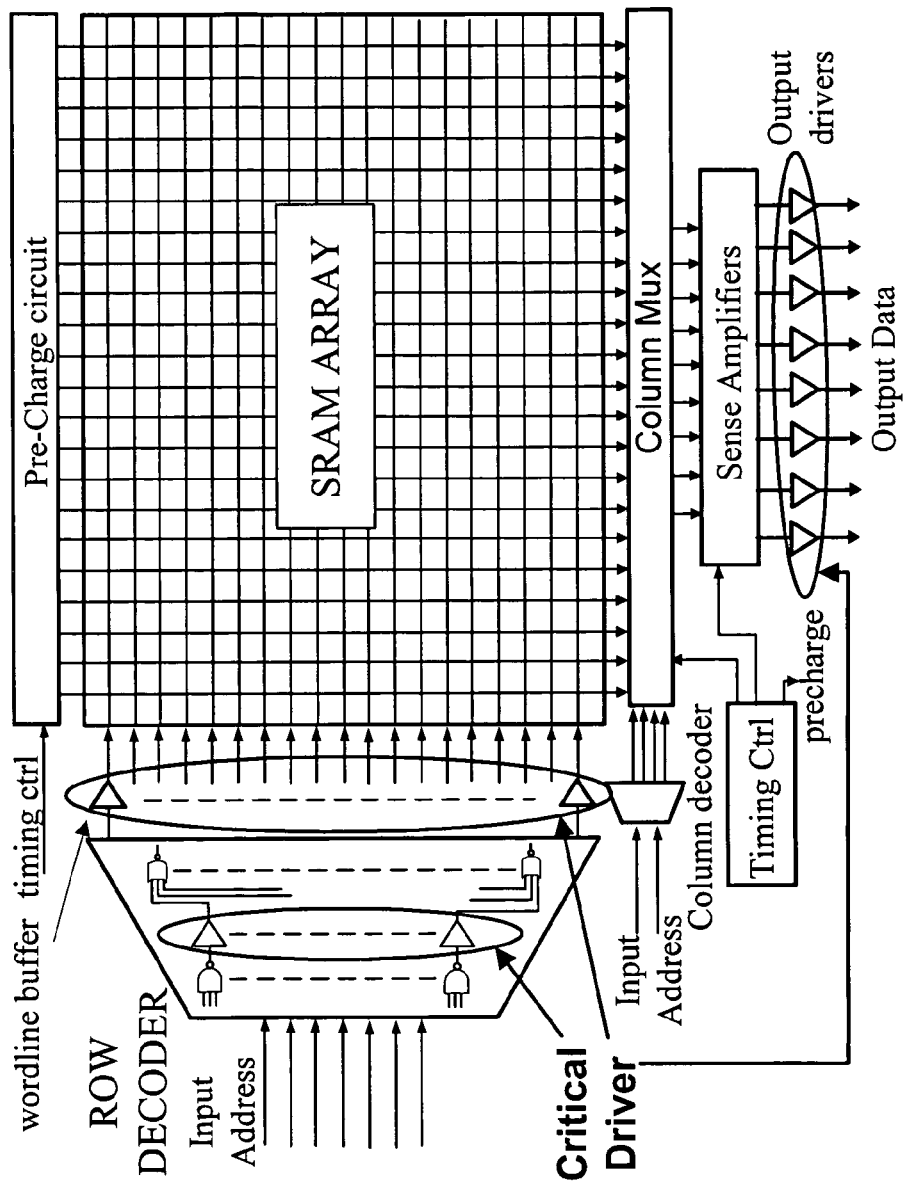
FIG. 14 shows a typical SRAM organisation and buffer insertion locations.

In typical small size SRAMs architectures the memory cells are not the only dominant components. The peripheral circuitry contributes considerably to the energy and delay, as described by B. S. Amrutur and M. A. Horowitz in "Speed and power scaling of SRAMs", IEEE Journal of Solid-State Circuits, Volume 35, Issue 2, February 2000, pp. 175-185. In fact, in small memories, the drivers are energy/delay critical circuits. They are strategically placed in the critical path of the memory in order to charge the big loads they drive (e.g. internal decoder, wordline and output drivers shown in FIG. 14) in a reasonable time. On the other hand, their impact in the overall memory area is rather limited. This makes these drivers ideal circuits to provide configuration "knobs" to the memory. Moreover placing configurable drivers in more than one place of the memory architecture (see FIG. 14), allows to generate even wider ranges at the global SRAM level due to the combination of their local impact.

Hereinafter a mathematical formulation is proposed for variable tapered buffer design offering boundary enveloping optimal, e.g. Pareto optimal energy/delay trade-offs for fixed load conditions. Such design approach is defined as trade-off or Pareto buffer design. Since the complexity of the analytical expressions involved in the exact formulation of the solution space grows very rapidly as the number of tapered stages increases, sufficiently accurate approximations have been developed that lead to pragmatic design rules that can be easily applied by circuit designers.

In this context, there is focussed on providing at least two configuration options (e.g., a slow, low energy option and a fast, high energy option) to small size SRAMs. A transistor level implementation is presented that allows to dynamically select at run-time a discrete set of switchable configurations for the key drivers present in embedded SRAMs, the discrete set of switchable configurations being pre-determined at design-time.

It has been reported by B. S. Amrutur and M. A. Horowitz in "Speed and power scaling of SRAMs", IEEE Journal of Solid-State Circuits, Volume 35, Issue 2, February 2000, pp. 175-185, that for small size SRAMs (<128 kbit) the decoder and the wordline drivers are responsible for about half of the energy and delay of the memory. Therefore, according to embodiments of the present invention, in particular these drivers may be selected to provide energy/delay trade-offs. Experimental results for a 1 kB 32-bit wide SRAM show that the run-time trade-offs created this way can be as wide as 64% in delay and 30% in energy and this with a very limited impact in area (less than 5% as estimated). The transistor level implementation and the configuration range have been validated via SPICE simulations.

Figure 15:
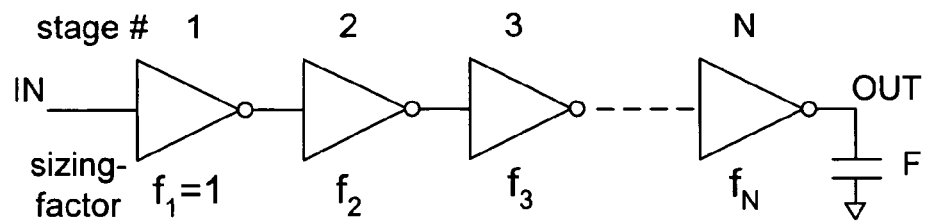
FIG. 15 illustrates a typical tapered buffer composition.

A trade-off or Pareto buffer is a set of variable-tapered buffers, as illustrated in FIG. 15, that each give a boundary enveloping optimal, e.g. a Pareto optimal energy/delay trade-off for fixed load conditions. A tapered buffer consists of a series of inverters, where each transistor channel width is a fixed multiple larger than that of the previous inverter in the series. Each configuration is thus composed of a number N of taper stages and a set of sizing factors $f_i$ (i from 1 to N) for each inverter. The sizing factor for an inverter is defined as the ratio between its input capacitance and that of the standard minimum sized inverter ($C_{min}$). Such minimum-sized inverter is assumed to have a dimension (W/L) of $4\lambda/2\lambda$ for an N transistor and $8\lambda/2\lambda$ for a P transistor. Similarly, the load can also be expressed as a factor F. The energy and delay of an N-stage tapered buffer can generally be expressed as follows as functions of the above parameters, as described by J. M. Rabaey, A. Chandrakasan and B. Nikolic in "Digital Integrated Circuits: a design perspective 2nd Edition"; *Pearson Education Intl.*, 2003:

$$\text{Delay} = t_{p0} \sum_{j=1}^{N} \left(1 + \frac{f_j + 1}{\gamma \times f_j}\right), f_{N+1} = F \quad (1)$$

$$\text{Energy} = C_{min} V_{dd}^2 \left(\sum_{j=1}^{N} (1+\gamma) \times f_j + F\right) \quad (2)$$

The parameter $\gamma$ in the above model is the ratio between the total intrinsic parasitic capacitance and the gate capacitance at the input of the inverter. The parameter $t_{p0}$ is the intrinsic delay of the minimum sized inverter. Both parameters are technology dependent. As the number of stages and the sizing factors directly determine the buffer energy and delay for a fixed load F, the trade-off or Pareto buffer design is equivalent to finding appropriate values for these parameters to generate boundary enveloping optimal, e.g. Pareto optimal trade-offs.

The determination of the trade-off or Pareto buffer configurations (number of stages N and sizing factors $f_i$) is strongly dependent on the load. For the typical SRAMs with size between 1 kB to 8 kB, it has been found that the load seen by the wordline buffer is between $16 \times C_{min}$ and $64 \times C_{min}$, while for the buffer situated in the row decoder (between the pre-decoder and the postdecoder stage) the load is between $32 \times C_{min}$ and $164 \times C_{min}$. It is to be noted that a classical two-stage NAND/NOR-based static CMOS decoder implementation has been assumed for the row decoder. Both loads are dependent on the memory organization. SRAMs are typically partitioned into several subarrays and have a pre-determined bitwidth, e.g. of 32-bit. To drive the corresponding loads, the typical number N of driver stages ranges from 2 to 4.

Given the number N of driver stages, an analytical formula that defines the trade-off or Pareto buffer configurations can be developed. For a two-stage tapered buffer, the energy and delay can be expressed in terms of the load F and the sizing factor $f_2$ of the second inverter:

$$\text{Delay}_{2s} = t_{p0}\left(1 + \frac{f_2}{\gamma} + 1 + \frac{F}{f_2}\right) \quad (3)$$

$$\text{Energy}_{2s} = C_{min} V_{dd}^2 (1 + \gamma + f_2 + \gamma f_2 + F) \quad (4)$$

Figure 16:
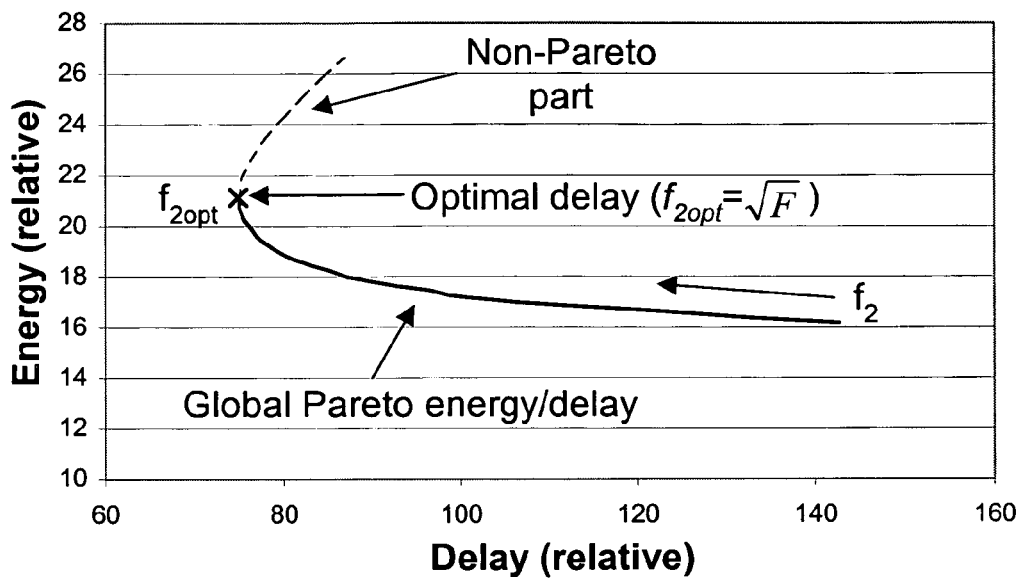
FIG. 16 illustrates energy and delay for a two-stage Pareto buffer (F=16).

As $\gamma$ is close to 1 for most DSM (distributed shared memory) processes, the above equation can be simplified. Based on this equation, the boundary enveloping energy/delay, e.g. the Pareto energy/delay for the tapered buffer is obtained by varying the only sizing factor $f_2$. $f_{2opt}$ gives the optimal delay for the buffer chain, as illustrated in FIG. 16. Clearly, as shown in FIG. 16, only part, i.e. the part in black solid line, of the entire energy/delay curve for the two-stage buffer is trade-off, e.g. Pareto optimal. When sizing factor $f_2$ becomes larger than $f_{2opt}$, the configurations can no longer give trade-off, e.g. Pareto optimal energy/delay results. Obviously, $f_{2opt}$ sets the upper bound that the sizing factor $f_2$ can be varied. Moreover, the two-stage buffer chain achieves minimum delay at $f_{2opt}$. Its value can be found by taking partial derivatives of equation (3) with respect to sizing factor $f_2$ and equating it to $$0 \left(\frac{\partial \text{Delay}_{2s}}{\partial f_2} = 0\right).$$

In this way, $f_{2opt}$ is obtained as $\sqrt{F}$. When the actual sizing factor $f_2$ becomes larger than that value, the minimum-sized inverter at the first stage will have too much load to drive thus leading too large delay in that stage to be compensated by the reduced delay in the second stage. Hence the total buffer chain delay becomes suboptimal.

Similarly, for a three-stage buffer, the energy/delay can be expressed by the following formulas (assuming $\gamma=1$):

$$\text{Delay}_{3s} = t_{p0}\left(3 + f_2 + \frac{f_3}{f_2} + \frac{F}{f_3}\right) \quad (5)$$

$$\text{Energy}_{3s} = C_{min} V_{dd}^2 (2 + 2f_2 + 2f_3 + F) \quad (6)$$

Figure 17:
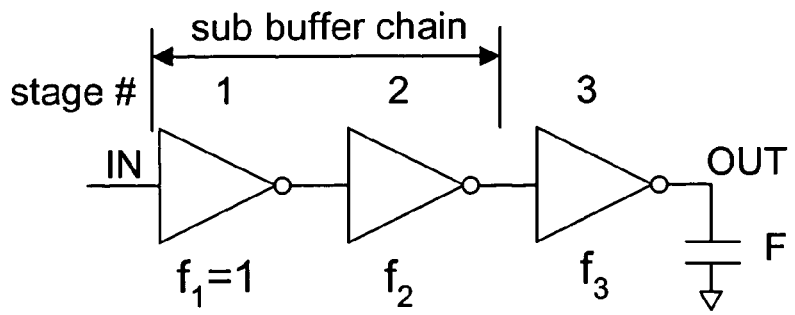
FIG. 17 illustrates local and global Pareto curves for three-stage buffer chain (F=38).
Figure 17:
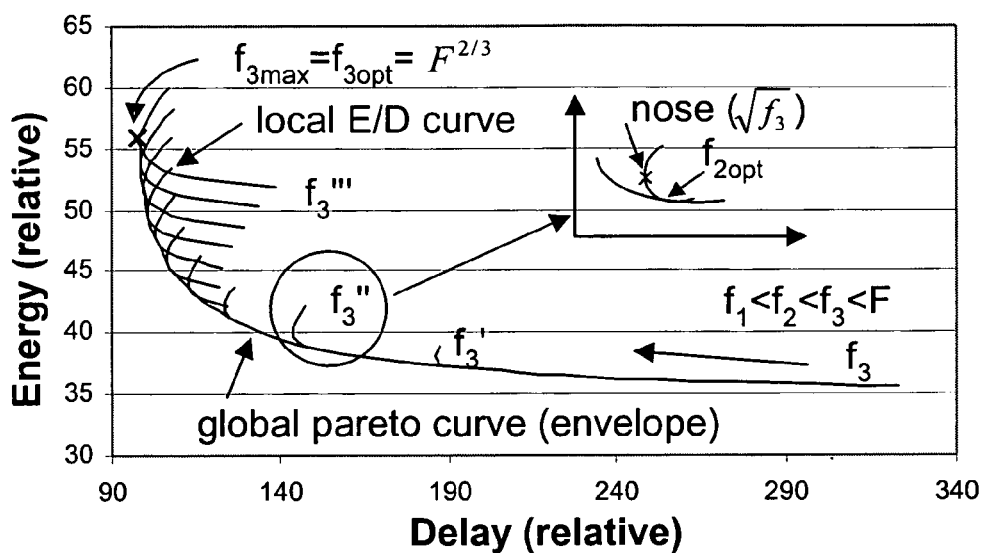

For this type of buffer, the trade-off, e.g. Pareto energy/delay search space can be built by keeping sizing factor $f_3$ as a parameter and sizing factor $f_2$ as a variable and varying them. Indeed it has been observed that, for a fixed sizing factor $f_3$, the total buffer energy/delay can be determined by the two-stage sub-buffer chain (see FIG. 17). That sub-buffer chain provides a local boundary enveloping energy/delay curve, e.g. a Pareto energy/delay curve for the fixed sizing factor $f_3$. By keeping sizing factor $f_3$ as a parameter and allowing sizing factor $f_2$ to vary for each sizing factor $f_3$, a family of curves is created which are locally trade-off optimal, e.g. Pareto optimal with respect to the sizing factor $f_3$ value (see FIG. 17). The global boundary enveloping, e.g. Pareto curve for that three-stage buffer chain is then the envelope of that family of local boundary enveloping, e.g. Pareto curves. Also indicated in FIG. 17 is that the "nose" (the minimum delay point) of a local curve is very close to the point which is on both local and global boundary enveloping curves, e.g. Pareto curves. According to the results in the two-stage buffer, the value for sizing factor $f_2$ on the nose is $\sqrt{f_3}$. Taking partial derivatives in equation (5) with respect to sizing factor $f_2$ and sizing factor $f_3$ and equating them to 0

$$\left(\frac{\partial Delay_{3s}}{\partial f_2} = 0, \frac{\partial Delay_{3s}}{\partial f_3} = 0\right)$$

obtains the optimal value for sizing factor $f_3$ at the minimum delay point of the three-stage buffer chain, where $f_3 = F^{2/3}$.

Detailed analysis on the trade-off or Pareto buffers also shows that the size of the current taper stage cannot exceed that of the next stage ($f_{i-1} < f_i$). This is obvious because for one configuration A which has $f_{i-1} > f_i$, there always exists another configuration B with $f'_{i-1} < f'_i$ that can achieve the same delay as A. Moreover, it can be easily proved that, $f'_{i-1} < f'_i$ and $f'_i < f_i$. This means configuration B consumes less energy than configuration A. As a trade-off or Pareto buffer configuration always has the lowest energy at a given delay, configuration A can never be a Pareto one.

Hereinafter the analysis made hereinabove will be extended for buffers using a variable number of stages.

Following the analysis done hereinabove, the global boundary enveloping curve, e.g. Pareto curve for an N-stage buffer chain is obtained by building the local boundary enveloping, e.g. Pareto curves for the N-1 sub-buffer chain where the sizing factor fN of the last stage is a parameter. Then, the envelope of the family of the local boundary enveloping, e.g. Pareto curves is the global boundary enveloping, e.g. Pareto curve for the N-stage buffer. In general, the envelope can be obtained mathematically as a function of only sizing factor fN of the last buffer in the chain and load F. For example, the closed form formula for the three-stage buffer is:

$$f_{2opt} = \frac{(f_3 + (f_3^2 + 4f_3^3 + 4Ff_3)^{0.5})f_3}{2(f_3^2 + F)} \quad (7)$$

$$Delay = t_{p0}\left(3 + \frac{(f_3 + (f_3^2 + 4f_3^3 + 4Ff_3)^{0.5})f_3}{2\gamma(f_3^2 + F)} + \frac{2(f_3^2 + F)}{(f_3 + (f_3^2 + 4f_3^3 + 4Ff_3)^{0.5})\gamma} + \frac{F}{\gamma f_3}\right) \quad (8)$$

$$Energy = C_{min}V_{dd}^2\left((1+\gamma)\left(1 + \frac{(f_3 + (f_3^2 + 4f_3^3 + 4Ff_3)^{0.5})f_3}{2(f_3^2 + F)} + f_3\right) + F\right) \quad (9)$$

With this approach, exact analytical formulas to obtain trade-off or Pareto buffer configuration parameters for an N-stage buffer are then possible, however, they become quite complex as N increases, making the physical relations between different parameters more vague.

Clearly, a simpler analytical formula for use in circuit design is desirable. In fact, for the three-stage trade-off or Pareto buffer analyzed above, a simple relation between sizing factors $f_2$ and $f_3$ can be established.

Figure 18:
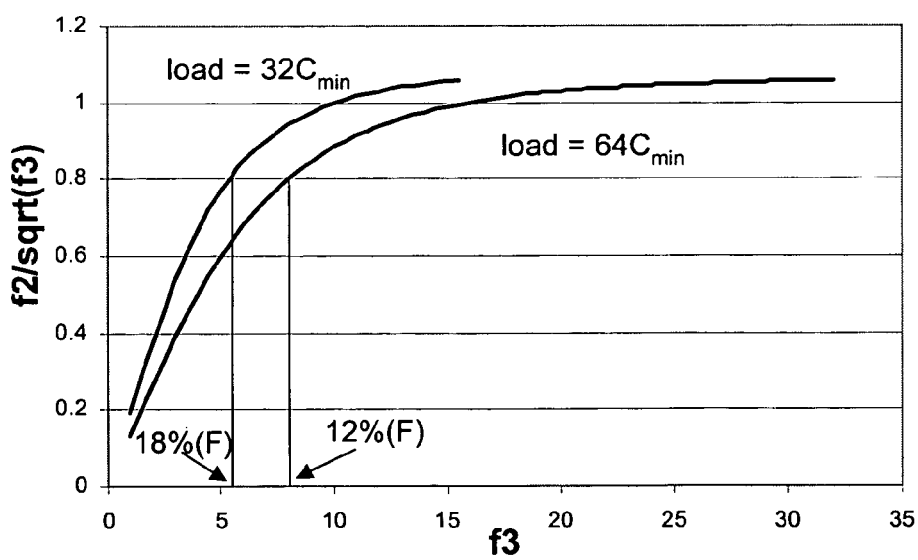
FIG. 18 illustrates the error of approximating $f_{20pt}$ under different loads.

It has been experimentally observed that when sizing factor $f_3$ becomes larger than 15% of the load F, the value resulting from the exact expression for $f_{2opt}$ gets very close to $\sqrt{f_3}$, which is the configuration minimizing delay when $f_3$ becomes load for the rest of buffer stages ($f_1$ and $f_2$). This is illustrated in FIG. 18 for two typical load conditions (load=32×$C_{min}$ and load=64×$C_{min}$). In FIG. 18, the y-axis measures the normalized error between the exact and the approximated value of $f_2$ ($f_{2opt}/\sqrt{f_3}$) and the x-axis gives the load presented by the last stage ($f_3$) towards the rest of the buffer stages. It can be observed that when the last stage is sufficiently large ($f_3 >= 15\%$ F), the exact expression of $f_{2opt}$ can be replaced by its approximated value ($\sqrt{f_3}$).

Figure 19:
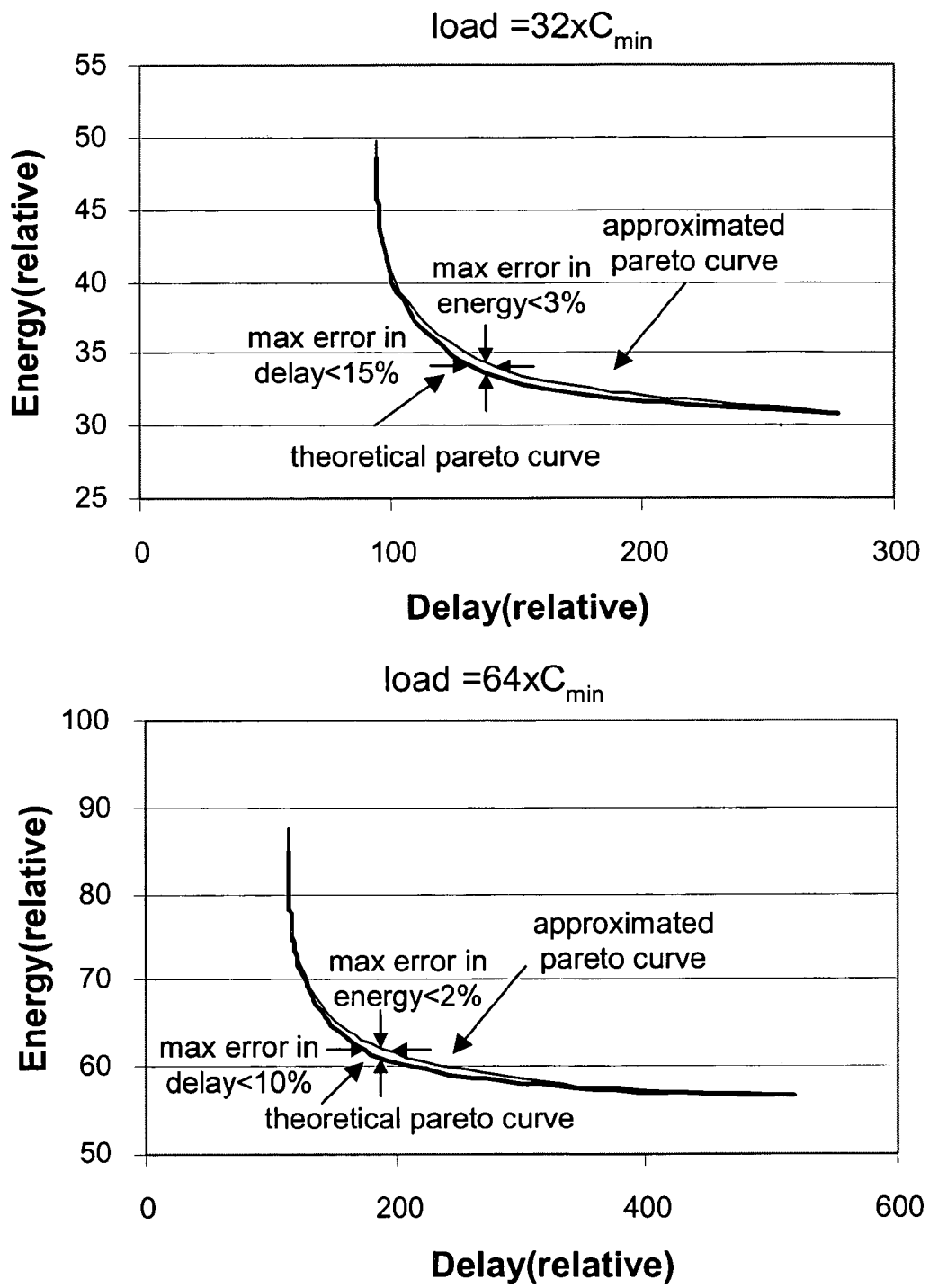
FIG. 19 shows a comparison between theoretical and approximated Pareto curves for a three-stage buffer at a first loads ($32 \times C_{min}$) and at a second load ($34 \times C_{min}$).

The reason for this can be explained physically in terms of both energy and delay. For energy, the load itself, the last stage inverter's input capacitance and the associated output parasitic capacitance dominates the entire buffer energy. This is indeed true when the size of the last inverter stage becomes sufficiently large ($f_3 >= 15\%$ F). In fact these two parameters ($f_3$ and F) decide the energy point for the trade-off or Pareto buffer. Under this condition, the rest of the buffer stages must provide the delay optimal configuration to give the fastest possible delay for that energy. This analysis can also be verified in FIG. 17 where one can see that the envelope point for the global boundary enveloping curve, e.g. Pareto curve is very close to the "nose" of the local boundary enveloping curve, e.g. Pareto curve, which is in fact defined by the minimum delay configuration for a given $f_3$. Moreover, the upper bound for $f_3$ to vary in the three-stage buffer is about 25%-30% F ($f_{3opt} = F^{2/3}$) which means large range for accurate approximation still exits after $f_3 >= 15\%$ F. On the other hand, for $f_3$ below 15% F the approximation is still valid with only a relatively larger error compared to the situation when $f_3$ is above 15% F. However, this error can be tolerated as the load and last stage inverter dominates the entire buffer energy. Such reasoning can also be verified in FIG. 19 where the theoretical and approximated boundary enveloping curves, e.g. Pareto curves are compared. Clearly, the errors between them are acceptable (less than 3% in energy and 15% in delay when the load F=32×$C_{min}$, less than 2% in energy and 10% in delay when the load F=64×$C_{min}$) which will not influence trade-off or Pareto buffer exploration. Therefore it is safe to conclude that replacing $f_{2opt}$ with $\sqrt{f_3}$ is valid in the full $f_3$ range.

According to the observation on the three-stage buffer, this approximation can therefore be generalized for an N-stage tapered buffer as follows:

$$f_i = f_N^{\frac{i-1}{N-1}} \text{ with } i \text{ from } 2 \text{ to } N-1 \text{ and } f_{N-1} \le f_N \le F^{\frac{N-1}{N}} \quad (10)$$

$$Delay = t_{p0}(N + (N-1)f_N^{1/(N-1)} + F/f_N) \quad (11)$$

$$Energy = C_{min}V_{dd}^2\left(2\left(1 + \sum_{m=1}^{N-1} f_N^{m/(N-1)}\right) + F\right) \quad (12)$$

Experimental results using different configurations up to a 5-taps buffer have also confirmed the accuracy of this approximation. They give an error of less than 3% in energy and 10% delay compared to the theoretical optimum and this error decreases as the load increases. Hence, for the typical loads found in small SRAMs (where 4-taps are sufficient), the approximation proposed hereinabove performs well enough. Still, extending the approximation beyond 5-taps can give quite accurate results due to above reasoning.

In this way, easy design rules for trade-off or Pareto buffer design are established to either find the Pareto optimal energy/delay trade-off range or obtain individual configurations based on the desired energy/delay specifications.

Figure 20:
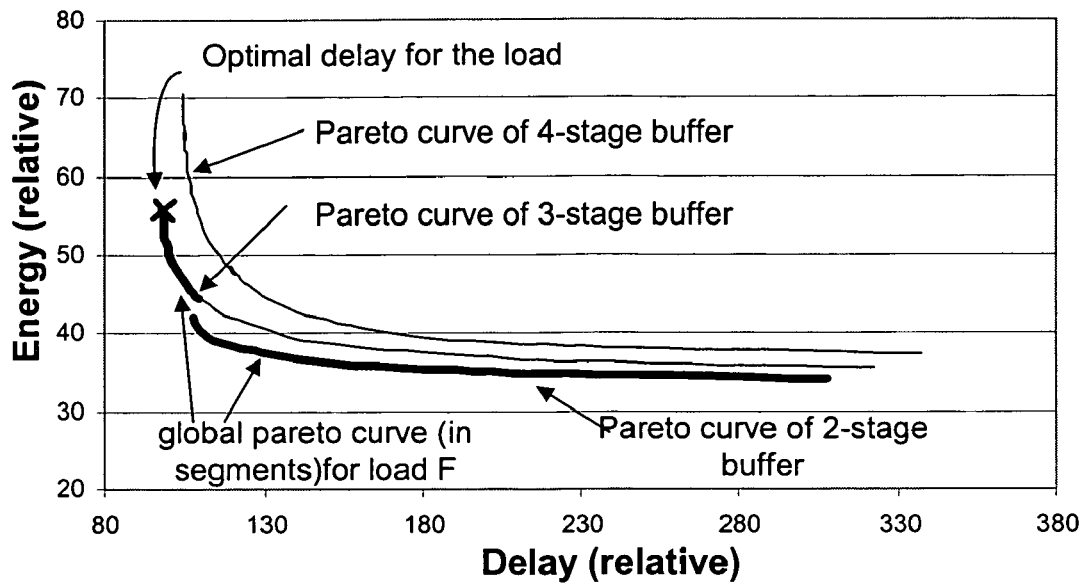
FIG. 20 shows Pareto curves of buffers with different number of stages driving a load suitable for three-stage buffer (F=32).

Given these manageable design rules, trade-off or Pareto configurations with different numbers of stages can be explored for a same load. FIG. 20 shows the global boundary enveloping curves, e.g. Pareto curves when using 2, 3 and 4 stages for a given load (F=32×$C_{min}$). Clearly, the global curve would be composed out of segments of the boundary enveloping curve, e.g. Pareto curve of each buffer with a different number of stages. However for this particular load (F=32× $C_{min}$), this is true only for configurations having three or fewer stages. It can be seen that in the case of four stages the whole boundary enveloping curve, e.g. Pareto curve becomes non-optimal when compared to the ones associated to the two and three stage configuration. In fact, a maximum number of stages Nmax exists theoretically for any given load. This is reasonable since using more stages than necessary will not reduce the delay. Thus it will only lead to energy overhead (see the graph for a four-stage buffer in FIG. 20). $N_{max}$ can be determined using classical tapered buffer design techniques as e.g. described by J. M. Rabaey, A. Chandrakasan and B. Nikolic in "Digital Integrated Circuits: a design perspective 2nd Edition"; Pearson Education Intl., 2003, which corresponds to the absolute minimum delay configuration ($N_{max=log4}F$). Moreover, non-integer $N_{max}$ can be rounded to the smallest integer greater than it. This helps capture the entire buffer energy/delay trade-off range, although with some errors.

To exploit the buffer configuration options at run time, switchable buffers can be added to the memory architecture. In fact, two to three options in one configurable buffer for a given load are already enough. These options divide the entire buffer trade-off range into several parts with reasonable energy/delay trade-off range. It does not make sense to use more options in between them because the sub-ranges will be even more squeezed leaving quite small trade-off ranges between two options. It will not help system level exploration to generate good memory trade-off ranges. Moreover, such fine grain approach will lead to very large overhead in the control, as well as area, in the configurable buffer. However, due to the combination of different buffer configurations at different locations in the architecture, as described with regard to FIG. 14, these buffer configurations can bring large trade-off ranges for the memory as a whole.

To minimize delay overhead in the implementation, the configurable buffers may be implemented following a $C^2MOS$-like style where each trade-off or Pareto buffer is built as a tri-state buffer.

Figure 21A:
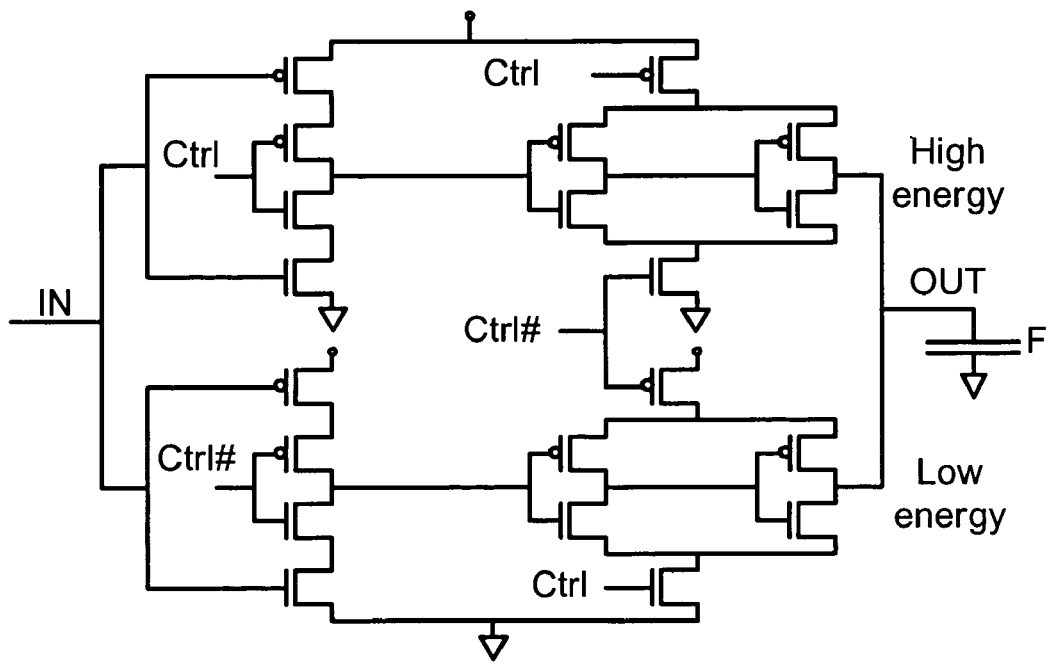
FIG. 21a illustrates one example of a run-time configurable buffer circuit according to an embodiment of the present invention.

FIG. 21a shows the implementation of a two-option configurable buffer. It is composed of a high speed trade-off or Pareto buffer and a low power one which share their input and output. Each buffer starts with a minimum-sized tri-state inverter. Its activation is controlled by external signals (Ctrl and its complement Ctrl#). The remaining stages of each buffer design are in $C^2MOS$ style and share the same gating transistors. This ensures the buffer performance while reducing the area overhead of the $C^2MOS$ buffer. In addition, these two buffers are controlled in a mutually exclusive way (with Ctrl and Ctrl#) to ensure only one is functional at any time.

The sharing of output between the two trade-off or Pareto buffers in the configurable implementation of FIG. 21a will bring extra load for each of them at the output node. This extra load comes from the parasitic output capacitance of the last stage on the other buffer. It does not significantly impact the high-speed buffer because this one has ample driving capability. Also the parasitic load contribution of the low-power buffer is small compared to that of the high-speed driver. However, this is not true in the case of a low-power buffer. For that one the solution space is built up considering the effect of the output parasitic capacitance of the high-speed configuration on the load. The present heuristic solution hence relies on first designing the high-speed configuration ignoring the effect of the low-power configuration on the load node and then sizing up the low-power configuration considering the parasitic impact of the actual high-speed configuration. In general, if there are more than two configurations, the global solution space considering the contribution of all the configuration stages should deal with this coupling.

Figure 21B:
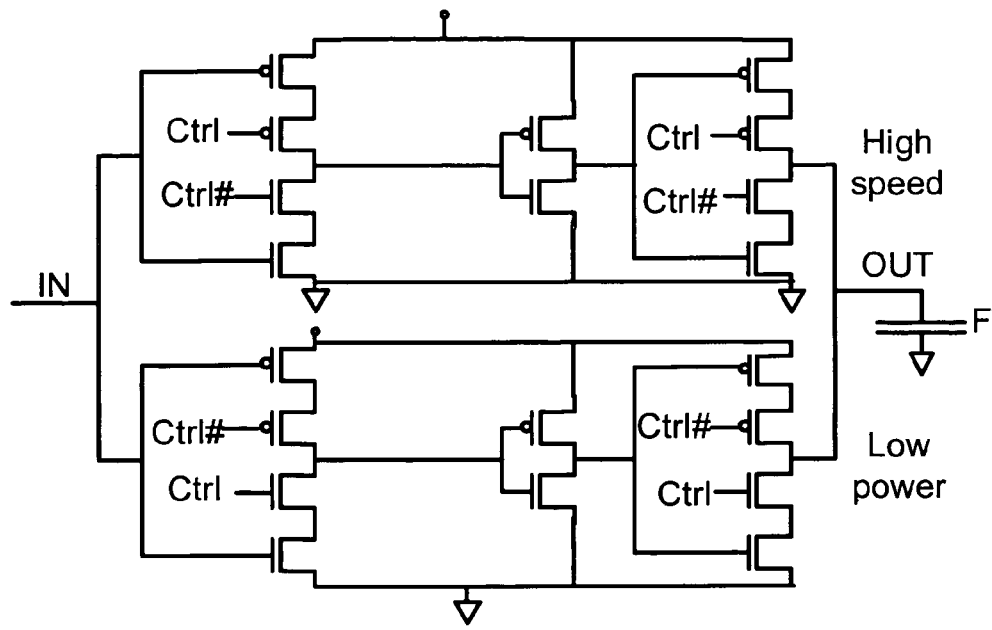
FIG. 21b illustrates another example of a run-time configurable buffer circuit according to an embodiment of the present invention.

FIG. 21b shows another switchable buffer implementation, which alleviates the problem of the high-speed buffer presenting too much load to the low power one due to charging issues. Although this implementation does not have such problem, energy overhead in the high-speed buffer is increased in comparison to the implementation of FIG. 21a.

The implementations of FIG. 21a and FIG. 21b show switching elements for configurability, which are applied in the current path of the logic gates.

In any case, the present design target for the low-power configuration is to ensure a reasonable performance and not to provide the lowest possible energy implementation at any delay cost. Similarly for the high-speed configuration the present design target is to dynamically select a point with a reasonable energy cost and not to provide the highest possible speed configuration at any energy cost. In fact, the reasonable design targets are not situated at the extreme points of the boundary enveloping curve, e.g. Pareto curve but those providing intermediate trade-offs. This is in fact a major strength of the approach according to embodiments of the present invention; having the global view of the trade-offs, the right design decisions can be made based on that information.

Figure 22:
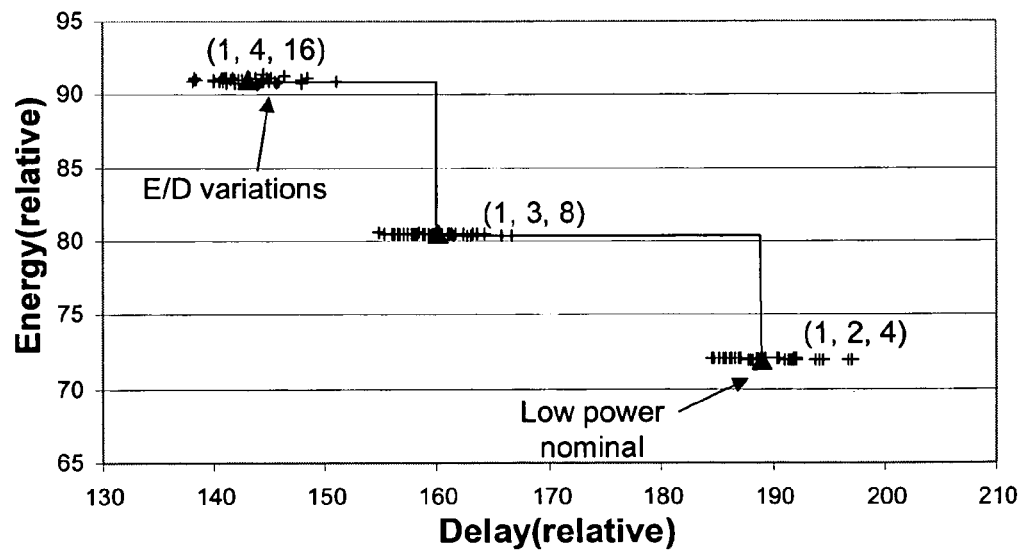
FIG. 22 shows SPICE results for energy/delay (under process variation effects) of a run-time configurable buffer used at the pre-decoder stage of a 1 kB SRAM.

To validate the configurable buffer implementation, an experiment on a three-option configurable buffer was carried with SPICE level simulation at 65 nm technology node. FIG. 22 shows the energy/delay of the each option in the configurable buffer, where the trade-off or Pareto configuration of each stage is presented as well. Clearly, a good trade-off range can be obtained with such an implementation. It is also obvious in the figure that using more than three options cannot bring enough trade-off range between two consecutive buffer options. Apart from evaluating the achievable trade-off ranges, the energy/delay of the configurable buffer under process variation are also investigated. For this purpose, each transistor in the buffer chains is injected with variation in threshold voltage Vt and current gain factor β. To get enough confidence on the result, 40 sets of different variations are simulated with the configurable buffer. Still, as shown in FIG. 22, the range for trade-offs provided by the switchable buffer remains under process variability impact. This is expected because the inverters in the buffer chain are usually large in size and hence are robust to process variability effects. This, in fact, indicates that the configurable buffer is a good candidate to create controllable energy/delay trade-offs at the memory level.

Figure 23:
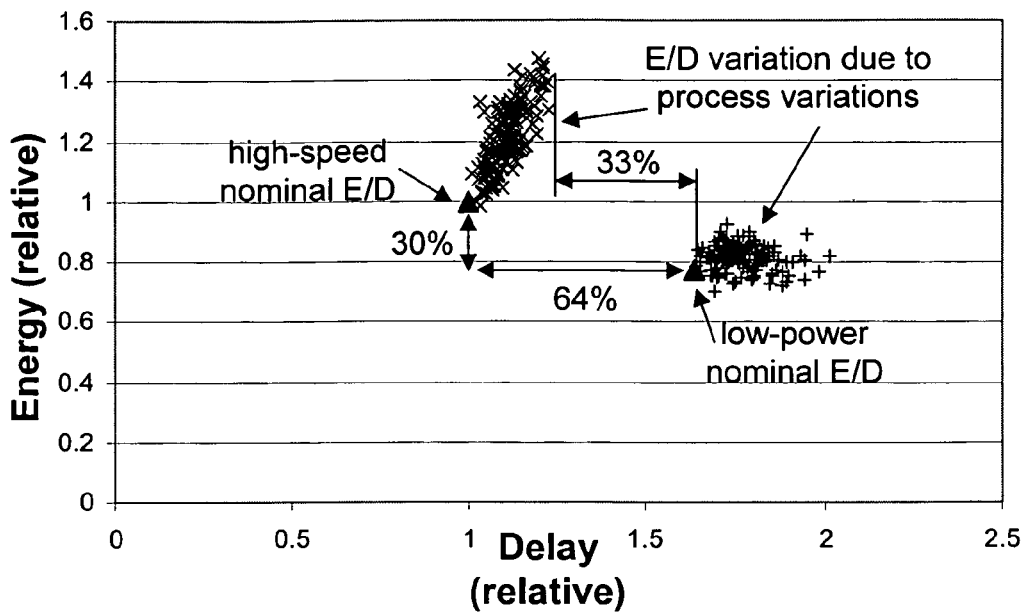
FIG. 23 shows SPICE results for run-time configurable memories offering two possible configurations, a low-energy one and a high-speed one.

To validate the current trade-off or Pareto buffer design methodology and run-time configurable buffer implementation approach at memory level, an experiment with a 1 kB embedded SRAM has been performed. This SRAM is designed for a 65 nm technology node and has the structure described above. Configurable buffers (with high speed and low power mode) are used instead of regular buffers to drive the large loads in both decoder and wordline. Each individual buffer was designed according to the actual memory load and has three stages. As process variability becomes prominent in this advanced technology node, each transistor in the Spice netlist is injected with variations in both threshold voltage Vt and current gain factor β. These variations are dependent on transistor size, the minimum sized transistor can have up to 10% variation in both threshold voltage Vt and current gain factor β and it decreases for larger transistors. Simulating the netlist in HSPICE gives the energy/delay trade-off (including variability effects) at the memory level, as illustrated in FIG. 23. Clearly, configurable buffers enable at memory level a very good trade-off range with nominally 64% in delay and 30% in energy. Moreover, the trade-off is robust even in the presence of process variability. The range in delay remains large in the worst-case situation (a range of 33%) even after variability characterization. This is somehow expected since the high-speed memory configuration should become more robust toward delay impact of variability due to the stronger driving capabilities of the buffer configuration selected. Therefore, switching of the memory from the low-power to high-speed mode to meet overall application timing is still possible.

The overhead of using configurable buffers in the memory is mainly in control and area. In fact, both of them are limited. As configurable buffers are used at the stages where large capacitive load is present, they only appear in limited locations, e.g., between the pre-decoder and the post-decoder stage in the decoder and as wordline drivers. In addition, the buffers in the same stage normally share the same control. The number of control signals will be quite limited (up to three at most). These control wires can be routed along with the address bits or the internal decoder buses. The control signal is generated at the system level by the memory controller which is common in modern SoCs. Thus the control of the configurable buffer will not induce a large area overhead. Moreover, the configuration of the buffer will not take place very often as one application can take quite a large amount of cycles to complete. Obviously, the energy and delay overhead in configuring the buffers are negligible and can be absorbed at system level.

The area overhead of using configurable buffers is also limited in the memory due to the large array of cells. Moreover, as the post-decoder is usually composed of a lot of static NAND or NOR gates, its height is larger than that of the pre-decoder. This difference brings many empty spaces in between the two decoder stages that can be used to place the configurable buffers (the height of the memory is still dominant by the array, the spaces are in between the sub-arrays). Estimation based on above facts shows configurable buffers only induce less than 5% overhead in the total memory area.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A driver circuit for driving a line terminated by a load, said driver circuit comprising a plurality of logic gates and having driver parameters, said driver parameters including the amplification value of at least two of said plurality of logic gates, wherein at least one of the driver parameters of the driver circuit is configurable, and wherein said driver circuit is configurable for design time selected energy/delay working points, determined for said load.

2. A driver circuit according to claims 1, wherein said driver circuit is dynamically configurable.

3. A driver circuit according to claim 2, wherein said driver circuit is configurable at run-time.

4. A driver circuit according to claim 1, the driver circuit comprising a plurality of logic gates coupled in a chain, wherein said driver parameters include the amount of logic gates involved in the chain.

5. A driver circuit according to claim 4, wherein at least part of said logic gates are arranged as a chain of logic gates.

6. A driver circuit according claim 4, wherein at least part of said logic gates are arranged in parallel.

7. A driver circuit according to claim 6, wherein said driver circuit comprises means for allowing connection to logic gates arranged in parallel.

8. A driver circuit according to claim 4, wherein said driver circuit comprises means allowing connection of a variable amount of logic gates to said line.

9. A driver circuit according to claim 8, at least part of said logic gates being arranged as a chain of logic gates, wherein said means allowing connection of a variable amount of logic gates to said line is adapted for performing a selection at an end of the chain.

10. A driver circuit according to claim 8, at least part of said logic gates being arranged as a chain of logic gates, wherein said means allowing connection of a variable amount of logic gates to said line is adapted for performing a selection within the chain.

11. A driver circuit according to claim 8, wherein said means for allowing connection is a circuit within the current path of the logic gate.

12. A driver circuit according to claim 1, wherein said line is a data communication pathway.

13. A driver circuit according to claim 12, wherein said data communication pathway is a segmented bus, and said driver circuit is adapted for providing optimal operation conditions for at least two different segment configurations.

14. A driver circuit according to claim 1, wherein said driver circuit is adapted for multi-dimensional routing of data.

15. Interconnect to provide data communication between functional elements within an essentially digital processing device, said interconnect comprising at least one configurable driver circuit according to claim 1.

16. A digital data processing device, comprising:
a first functional element to perform a first data processing function,
a second functional element to perform a second data processing function, and
an interconnect between said first functional element and said second functional element to provide data communication there between,
wherein said interconnect comprises at least one configurable driver circuit according to claim 1.

17. A run-time controller, adapted for configuring parameters of drivers of claim 1 at run-time.

18. A run-time controller according to claim 17, comprising a storage means for storing energy/delay working points.

19. A run-time controller according to claim 18, furthermore comprising a means for dynamically selecting, based on an external request, a stored working point.

20. A run-time controller according to claim 17, furthermore comprising circuitry for generating steering signals for input and output logic, in accordance with the selected working point.

21. A driver circuit according to claim 1, wherein said working points are pareto optimal working points.

22. An essentially digital device comprising a plurality of resources and an interconnection means between said resources including at least one line terminated by a load, wherein the essentially digital device furthermore comprising a driver circuit for driving a line terminated by a load, said driver circuit is configurable for design time selected optimal energy/delay working points, determined for said load and wherein the essentially digital device has a segmented bus and said driver circuit is adapted for providing optimal operation conditions for at least two different segment configurations.

23. An essentially digital device comprising a plurality of resources and an interconnection means between said resources including at least one line terminated by a load, wherein the essentially digital device furthermore comprising a driver circuit for driving a line terminated by a load, said driver circuit is configurable for design time selected optimal energy/delay working points, determined for said load, and wherein within said essentially digital device data transfers are performed between source resources and destination resources during scheduling intervals for said transfers, wherein at least one line temporarily facilitates two transfers with partially overlapping scheduling intervals, said line comprising a switch, defining segments within said line, said essentially digital device being characterised in that said driver circuit is capable of providing optimal operating conditions for at least two different segment configurations.

24. An essentially digital device comprising a plurality of resources and an interconnection means between said resources including at least one line terminated by a load, wherein the essentially digital device furthermore comprises a driver circuit for driving a line terminated by a load, said driver circuit is configurable for design time selected optimal energy/delay working points, determined for said load wherein within said essentially digital device data transfers are performed between source resources and destination resources during scheduling intervals for said transfers, wherein at least one line temporarily facilitates two transfers with partially overlapping scheduling intervals, said line comprising a switch, defining segments within said line, said essentially digital device being characterised in that each of said segments have a run-time configurable driver.

25. An essentially digital device comprising a plurality of resources and an interconnection means between said resources including at least one line terminated by a load, wherein the essentially digital device furthermore comprises a driver circuit for driving a line terminated by a load, said driver circuit is configurable for design time selected optimal energy/delay working points, determined for said load, wherein said digital device, comprising a run-time controller, is adapted for selecting parameters of said driver circuit at run-time and wherein the run-time controller selects said parameters from a pre-determined set of parameter value groups, each parameter value group uniquely corresponding to an energy consumption by said essentially digital device and a function of execution time of said essentially digital device.

26. An essentially digital device according to claim 25, wherein said run-time controller is integrated with a switch controller.

27. A driver circuit for driving a line terminated by a load, said driver circuit comprising a plurality of logic gates and having driver parameters, wherein at least one of the driver parameters of the driver circuit is configurable, and wherein said driver circuit is configurable for design time selected optimal energy/delay working points, determined for said load, wherein said driver parameters include the voltage swing.

* * * * *